United States Patent
Sochava et al.

(10) Patent No.: US 7,257,142 B2
(45) Date of Patent: Aug. 14, 2007

(54) SEMI-INTEGRATED DESIGNS FOR EXTERNAL CAVITY TUNABLE LASERS

(75) Inventors: Sergei L. Sochava, Sunnyvale, CA (US); William B. Chapman, Sunnyvale, CA (US); William J. Kozlovsky, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 336 days.

(21) Appl. No.: 10/811,712

(22) Filed: Mar. 29, 2004

(65) Prior Publication Data

US 2005/0213618 A1  Sep. 29, 2005

(51) Int. Cl.
*H01S 3/10* (2006.01)
*H01S 5/00* (2006.01)
*H01S 3/082* (2006.01)

(52) U.S. Cl. .................. 372/50.1; 372/20; 372/97
(58) Field of Classification Search .................. 372/20, 372/92, 98, 50.1, 97
See application file for complete search history.

(56) References Cited

U.S. PATENT DOCUMENTS

| | | | |
|---|---|---|---|
| 5,319,659 A | | 6/1994 | Hohimer |
| 5,459,747 A | | 10/1995 | Takiguchi et al. |
| 5,579,327 A | * | 11/1996 | Ohtateme et al. ............. 372/20 |
| 5,592,503 A | * | 1/1997 | Welch et al. ............. 372/50.11 |
| 6,137,814 A | * | 10/2000 | Brosson et al. ................ 372/33 |
| 6,295,308 B1 | * | 9/2001 | Zah ........................... 372/50.1 |
| 6,665,321 B1 | | 12/2003 | Sochava et al. |
| 6,822,981 B2 | * | 11/2004 | Jacquet ......................... 372/20 |
| 2002/0054614 A1 | | 5/2002 | Jin |
| 2002/0131466 A1 | * | 9/2002 | Salvatore et al. ............. 372/50 |
| 2002/0172239 A1 | * | 11/2002 | McDonald et al. ........... 372/20 |
| 2003/0086448 A1 | | 5/2003 | Deacon |
| 2003/0161570 A1 | | 8/2003 | Paniccia |
| 2004/0071181 A1 | * | 4/2004 | Huang ......................... 372/106 |
| 2005/0025500 A1 | * | 2/2005 | Hallemeier et al. ......... 398/186 |

FOREIGN PATENT DOCUMENTS

EP          0 687 045 A2    12/1995
WO PCT/US/2005/009193    6/2005

* cited by examiner

*Primary Examiner*—Armando Rodriguez
(74) *Attorney, Agent, or Firm*—Blakely, Sokoloff, Taylor & Zafman LLP

(57) ABSTRACT

Semi-integrated external cavity diode laser (ECDL) designs including integrated structures comprising a gain section, phase control section, and optional modulator section. Each integrated structure includes a waveguide that passes through each of the sections. A mirror is defined in the structure to define one end of a laser cavity. A reflective element is disposed generally opposite a rear facet of the gain section, forming an external cavity therebetween. A tunable filter is disposed in the external cavity to effectuate tuning of the laser. During operation, a modulated drive signal is provided to the phase control section. This modulates an optical path length of the laser cavity, which produces an intensity (amplitude) modulation in the laser output. A detector is employed to produce a feedback signal indicative of the intensity modulation that is used for tuning the laser in accordance with a wavelength locking servo loop. Upon passing through the modulator section, an optical signal is modulated with data.

20 Claims, 15 Drawing Sheets

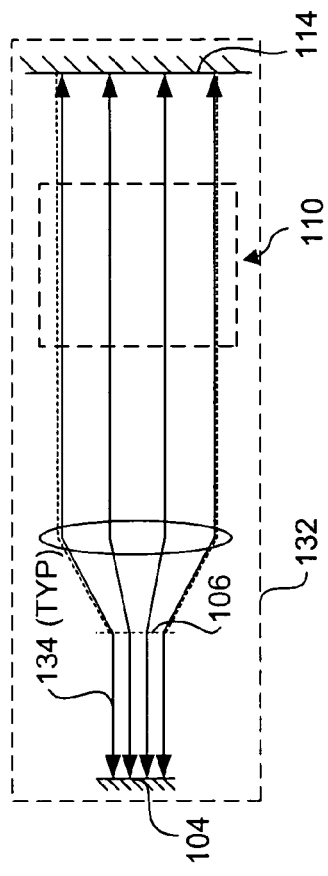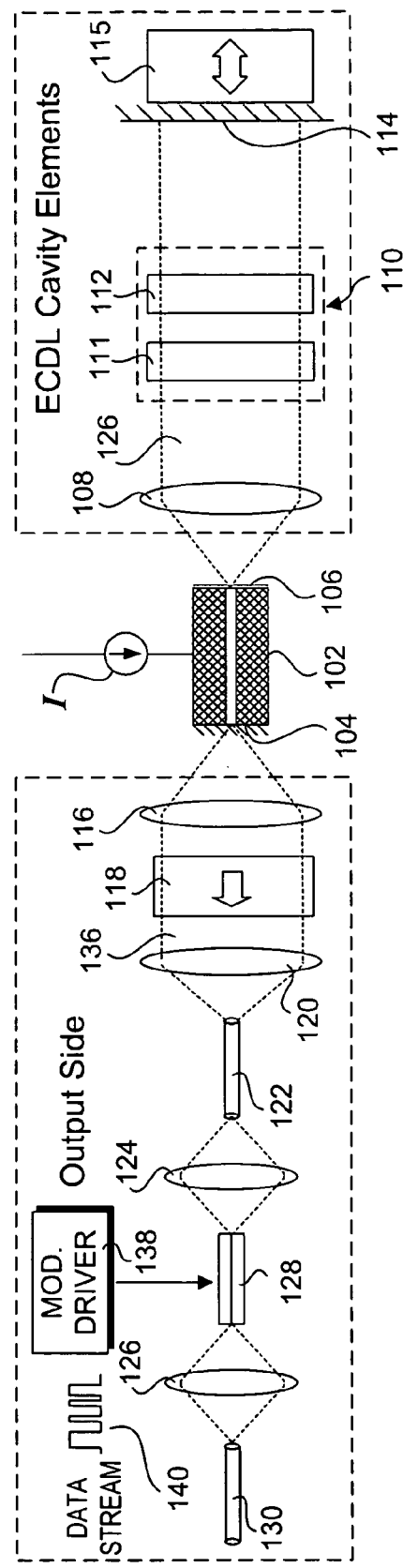
*Fig. 1b*
*Fig. 1a (Prior Art)*

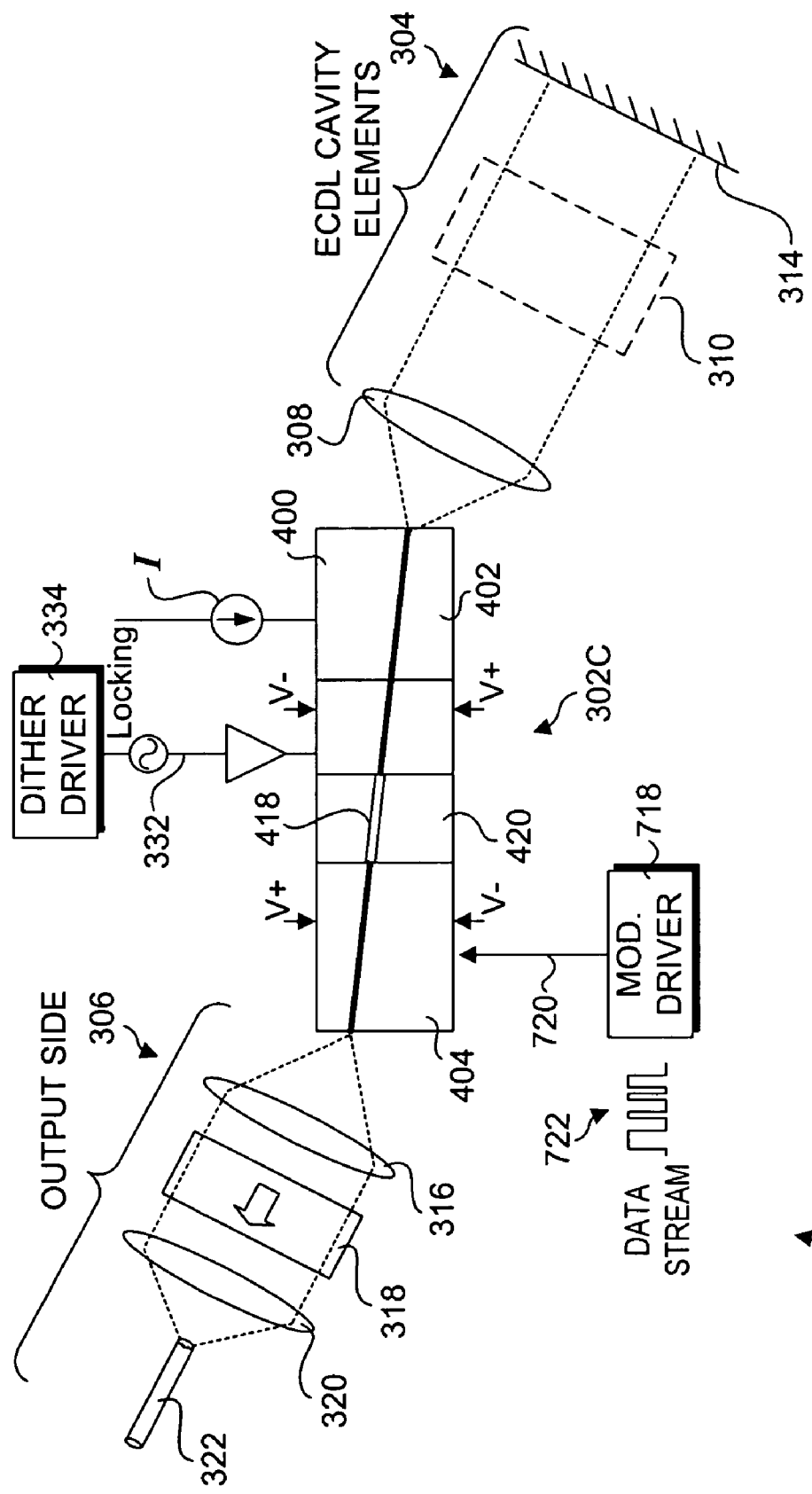

SEMI-INTEGRATED DESIGNS FOR EXTERNAL CAVITY TUNABLE LASERS

FIELD OF THE INVENTION

The field of invention relates generally to optical communication systems and, more specifically but not exclusively relates to enhanced tunable lasers and methods for laser apparatuses that provide enhanced tuning via semi-integrated designs.

BACKGROUND INFORMATION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overrcome the limitations of individual DFB devices. Various laser-tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with all other external cavity modes that are within the gain bandwidth of the cavity. These goals have been difficult to achieve, and there is accordingly a need for an external cavity laser that provides stable, single mode operation at selectable wavelengths.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 1a is a schematic diagram of a generalized external cavity laser for which various embodiments of the invention may be derived in accordance with the teachings and principles disclosed herein;

FIG. 1b is a schematic diagram illustrating a laser cavity defined by a partially-reflective front facet of a Fabry-Perot gain chip and a reflective element;

FIG. 3c is a schematic diagram illustrating a third exemplary semi-integrated ECDL configuration including an integrated structure having gain, phase control, mirror, and modulator sections, wherein the mirror section includes a portion of a tilted waveguide configured as a chirped Bragg grating that operates as a partially-reflective mirror, according to one embodiment of the invention;

FIG. 4a is a schematic diagram illustrating further details of the integrated structure of FIG. 3a;

DETAILED DESCRIPTION OF PREFERRED EMBODIMENTS

Figure 2:
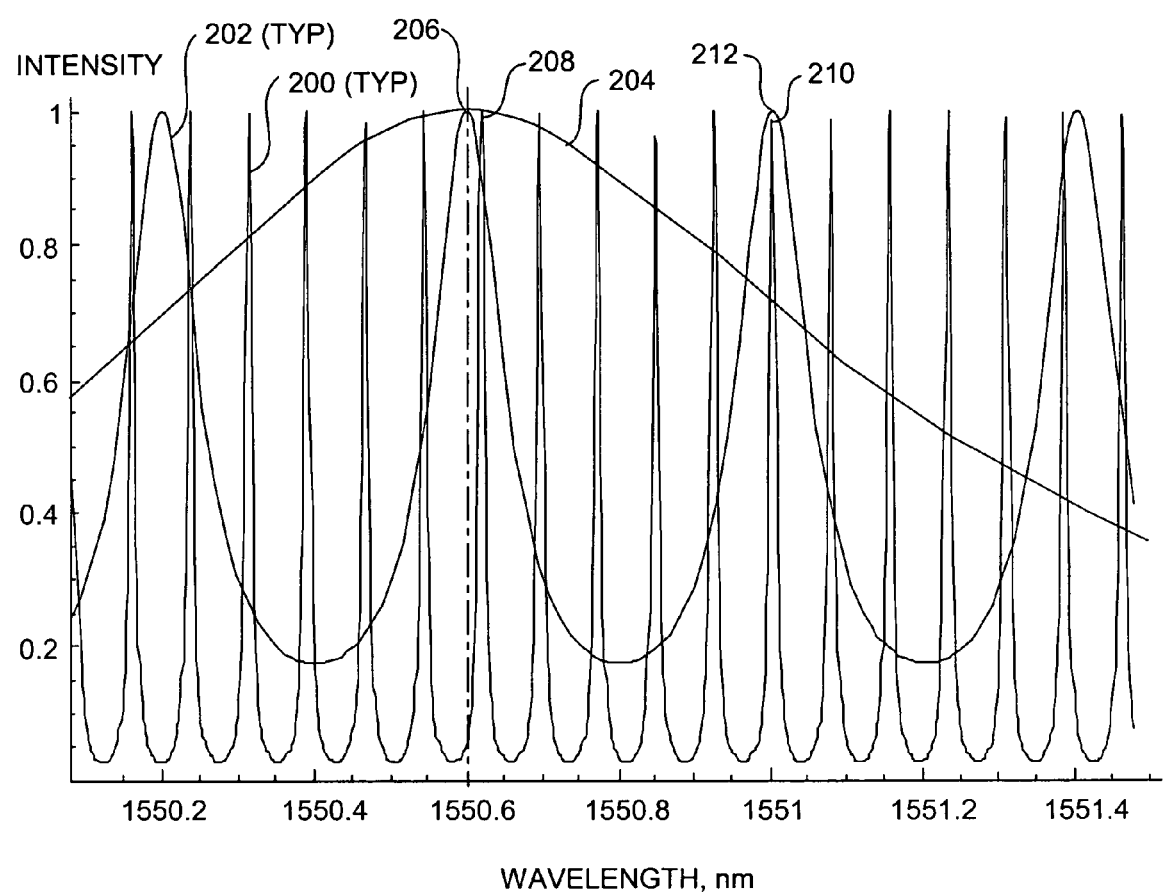
FIG. 2 is a diagram illustrating a relative position of a laser cavity's lasing modes with respect to transmission peaks defined by an intra-cavity etalon and channel selector.

Embodiments of laser apparatuses that employ a semi-integrated designs and methods for manufacturing the laser apparatus are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The embodiments of the present invention described below employ a semi-integrated design for external cavity tunable lasers. In order to better understand and appreciate aspects of these embodiments, a brief discussion of the operation and design of conventional external cavity tunable lasers is now presented.

Discrete wavelength tunable diode lasers typically comprise a semiconductor gain medium, two reflectors, and an intra-cavity tuning mechanism. For example, as an overview, a generalized embodiment of an external cavity diode laser (ECDL) 100 configured for optical communication is shown in FIG. 1a. ECDL 100 includes a gain medium comprising a diode gain chip 102. Diode gain chip 102 comprises a Fabry-Perot diode laser including a partially-reflective front facet 104 and a substantially non-reflective rear facet 106 coated with an anti-reflective (AR) coating to minimize reflections at its face. Optionally, diode gain chip 102 may comprise a bent-waveguide structure on the gain medium to realize the non-reflective rear facet 106 (not shown). The external cavity elements include a diode intracavity collimating lens 108, tuning filter element or elements 110 (e.g., etalons 111 and 112), and a reflective element 114. In general, reflective element 114 may comprise a mirror, grating, prism, or other reflector or retroreflector that may also provide the tuning filter function in place of tuning element 110. Also depicted as an ECDL cavity element is a pathlength modulation element 115. This element, which typically comprises a mechanical or thermal actuator, or an electro-optical element, is employed to modulate (dither) the optical pathlength of the laser cavity to induce a perturbation from which an error signal can be derived, as described below in further detail.

In addition to the ECDL cavity elements, a conventional communication laser of this type employs several output side elements used for isolation and data modulation. The output side elements illustrated in FIG. 1a include a diode output collimating lens 116, an optical isolator 118, a fiber focusing lens 120, a fiber pigtail 122 a pair of coupling lenses 124 and 126, a modulator 128 and an output fiber segment 130.

The basic operation of ECDL 100 is a follows. A controllable current I is supplied to diode gain chip 102 (the gain medium), resulting in a voltage differential across the diode junction, which produces an emission of optical energy (photons). (As depicted in the Figures herein, currents and voltages are shown as applied to the top and bottom of the structures for convenience. In practice, the currents and voltages are applied across planes that are parallel to the page plane.) The emitted photons pass back and forth between partially-reflective front facet 104 and reflective element 114, which collectively define the ends of an "effective" laser cavity (i.e., the two reflectors discussed above), as depicted by laser cavity 132 in FIG. 1b. As the photons pass back and forth, a plurality of resonances, or "lasing" modes are produced. Under a lasing mode, a portion of the optical energy (photons) temporarily occupies the external laser cavity, as depicted by an intracavity optical beam depicted as light rays 134; at the same time, a portion of the photons in the external laser cavity eventually passes through partially-reflective facet 104.

Light comprising the photons that exit the laser cavity through partially-reflective front facet 104 passes through diode output collimating lens 116, which collimates the light into a light beam 136. The output beam then passes through optical isolator 118. The optical isolator is employed to prevent back-reflected light from being passed back into the external laser cavity, and is generally an optional element. After the light beam passes through the optical isolator, it is launched into fiber pigtail 122 by fiber focusing lens 120. Generally, output fiber 122 may comprise a polarization-preserving type or a single-mode type such as SMF-28.

Through appropriate modulation of the input current (generally for communication rates of up to 2.5 GHz) or through modulation of an external element disposed in the optical path of the output beam (as shown in FIG. 1a) (for 10 GHz and 40 GHz communication rates), data can be modulated on the output beam to produce an optical data signal. Such a signal may be launched into a fiber and transmitted over a fiber-based network in accordance with practices well known in the optical communication arts, thereby providing very high bandwidth communication capabilities.

FIG. 1a shows an example of an external modulation scheme. Light entering fiber pigtail 122 exits the fiber to form an angular cone having a maximum angle corresponding to the numerical aperture of the fiber. As light passes through coupling lens 124, it is focused toward an input end of modulator 128. Modulator 128 is driven by a modulation driver 138 that causes the transmittance of the modulator 128 to be modulated based on logic levels defined in an input data stream 140. The modulation of the modulator's transmittance causes a modulation in the amplitude of the optical output signal. This, in turn, can be detected at a receiver to extract the data stream.

The lasing mode of an ECDL is a function of the total optical path length between the cavity ends (the cavity optical path length); that is, the optical path length encountered as the light passes through the various optical elements and spaces between those elements and the cavity ends defined by partially-reflective front facet 104 and reflective element 114. This includes diode gain chip 102, diode intracavity collimating lens 108, tuning filter elements 110, plus the path lengths between the optical elements (i.e., the path length of the transmission medium occupying the ECDL cavity, which is typically a gas such as air). More precisely, the total optical path length is the sum of the path lengths through each optical element and the transmission medium times the coefficient of refraction for that element or medium.

As discussed above, under a lasing mode, photons pass back and forth between the cavity end reflectors at a resonance frequency, which is a function of the cavity optical path length. In fact, without the tuning filter elements, the laser would resonate at multiple frequencies, producing a multi-mode output signal. Longitudinal laser modes occur at each frequency where the roundtrip phase accumulation is an exact multiple of $2\pi$. For simplicity, if we model the laser cavity as a Fabry-Perot cavity, these frequencies can be determined from the following equation:

$$L = \frac{\lambda x}{2n} \quad (1)$$

where $\lambda$=wavelength, L=optical length of the cavity, x=an arbitrary integer—1, 2, 3, . . . , and n=refractive index of the medium. The average frequency spacing can be derived from equation (1) to yield:

$$\Delta v = \frac{c}{2nL} \quad (2)$$

where $v=c/\lambda$ and c is the speed of light. The number of resonant frequencies is determined from the width of the gain spectrum. The corresponding lasing modes for the cavity resonant frequencies are commonly referred to as "cavity modes," an example of which is depicted by cavity modes 200 in FIG. 2.

Semiconductor laser gain media typically have broad gain spectra and therefore require spectral filtering to achieve single longitudinal mode operations (i.e., operations at a single wavelength or frequency). In order to produce an output at a single frequency, filtering mechanisms are employed to substantially attenuate all lasing modes except for the lasing mode corresponding to the desired frequency. As discussed above, in one scheme a pair of etalons, depicted as a grid generator 111 and a channel selector 112 in FIG. 1, are employed for this filtering operation. A grid generator, which comprises a static etalon that operates as a Fabry-Perot resonator, defines a plurality of transmission peaks (also referred to as passbands) in accordance with equations (1) and (2). Ideally, during operation the transmission peaks remained fixed, hence the term "static" etalon; in practice, it may be necessary to employ a servo loop (e.g., a temperature control loop) to maintain the transmission peaks at the desired location. Since the cavity length for the grid generator is less than the cavity length for the laser cavity, the spacing (in wavelength) between the transmission peaks is greater for the grid generator than that for the cavity modes. A set of transmission peaks 202 corresponding to an exemplary etalon grid generator is shown in FIG. 2. Note that at the peaks of the waveform the intensity (relative in the figure) is a maximum, while it is a minimum at the troughs. Generally, the location and spacing of the transmission peaks for the grid generator will correspond to a set of channel frequencies defined by the communication standard the laser is to be employed for, such as the ITU channels and 0.04 nanometer (nm) spacing discussed above and depicted in FIG. 2. Furthermore, the spacing of the transmission peaks corresponds to the free spectral range (FSR) of the grid generator.

A channel selector, such as an adjustable etalon, is employed to select the lasing mode of the laser output. For illustrative purposes, in one embodiment channel selector 112 may comprise an etalon having a width substantially less than the etalon employed for the grid generator. In this case, the FSR of the channel selector is substantially larger than that of the grid generator; thus the bandpass waveform of the channel selector is broadened, as illustrated by channel selector bandpass waveform 204 having a single transmission peak 206. In accordance with this channel selection technique, a desired channel can be selected by aligning the single transmission peak of the channel selector (e.g. 206) with one of the transmission peaks of the grid generator. For example, in the illustrated configuration depicted in FIG. 2, the selected channel has a frequency corresponding to a laser output having a 1550.6 nm wavelength.

In addition to the foregoing scheme, several other channel selecting mechanisms may be implemented, including rotating a diffraction grating; electrically adjusting a tunable liquid crystal etalon; mechanically translating a wedge-shaped etalon (thereby adjusting its effective cavity length); and "Vernier" tuning, wherein etalons of the same finesses and slightly different FSRs are employed, and a respective pair of transmission peaks from among the transmission peaks defined by the etalons are aligned to select the channel in a manner similar to that employed when using a Vernier scale.

As discussed above, other types of tunable laser designs have been considered and/or implemented. In addition to DFB lasers, these include Distributed Bragg Reflector (DBR) lasers. Both DBR and DFB lasers are considered "integrated" lasers because all of the laser components are integrated in a common component. While this is advantageous for manufacturing, an integrated scheme means tuning is coupled to laser diode operation. This results in lower tuning quality when compared with ECDLs.

For example, DFB lasers have a problem with aging. More specifically, as a DFB laser is used, the characteristics of the gain section change over time. This phenomena is known as "aging." Aging results in a wavelength shift, since the frequency reference and the active gain section are coupled in one chip. In contrast, the frequency reference (i.e., filter elements) are de-coupled from the gain chip for ECDL's, providing improved frequency stability over time.

Another advantage of ECDLs over DFB lasers is spectral characteristics. The much longer lasing cavity in ECDLs provides very narrow linewidth and very good side-mode suppression ratios.

DBR lasers are very similar to DFB lasers. The major difference is that where DFB lasers have a grating within the active region of the cavity, DBR lasers have a partitioned cavity with the grating in a region that is not active (i.e., amplifying). While this provides some isolation from the chirp effect inherent with DFB designs, the tuning characteristics of tunable DBR lasers still leave much to be desired.

The inherent advantage of the ECDL design over the highly integrated DFB and DBR designs is the fact that the tunable filter of the ECDL is decoupled from the gain region, and therefore can be made very stable. As a result, unlike DFB and DBR lasers, ECDL's may not require external wavelength lockers. The separate tuner in an ECDL may be controlled with essentially no cross-talk to other controlled parameters, such as laser diode current, and this can lead to simplified and more robust tuning algorithms than are typical of fully-integrated tunable lasers.

On the other hand, the lack of integration in the conventional ECDL design leads to additional parts count and makes manufacturing of ECDL more labor-intensive and costly. In addition, phase control of existing ECDL designs is slow with respect to requirements for next-generation fast-tuning lasers.

In addressing the foregoing problems, embodiments of the invention described below employ "semi-integrated" designs that combine the manufacturing benefits of integrated structures while decoupling the tuning and gain functions. Thus, the semi-integrated designs provide the tuning capabilities inherent in the de-coupled ECDL design without the manufacturing complexity and costs of the conventional ECDL design.

Figure 3A:
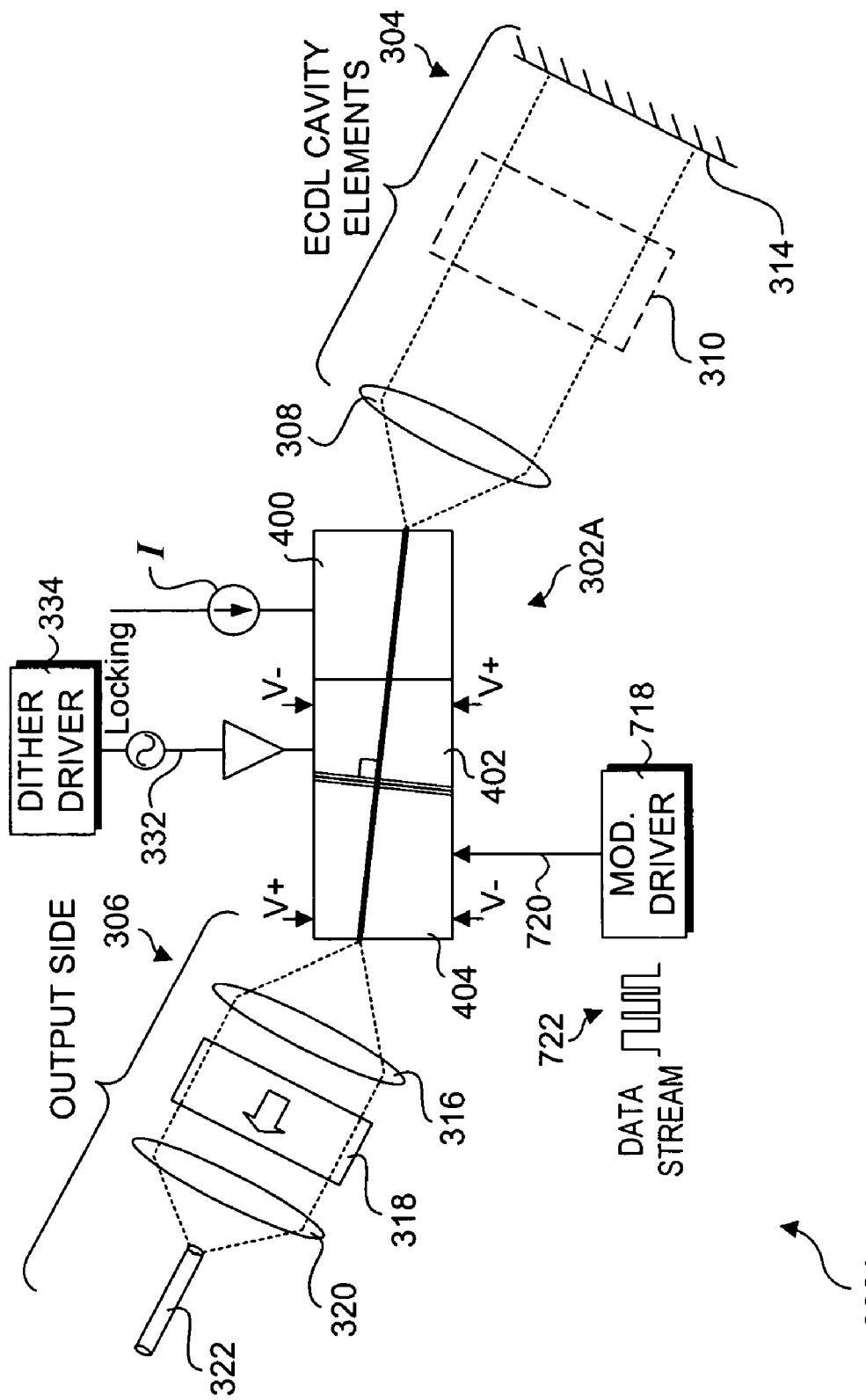
FIG. 3a is a schematic diagram illustrating a first exemplary semi-integrated external-cavity diode laser (ECDL) configuration including an integrated structure having gain, phase control, and modulator sections that are optically-coupled via a tilted waveguide, according to one embodiment of the invention.
Figure 3B:
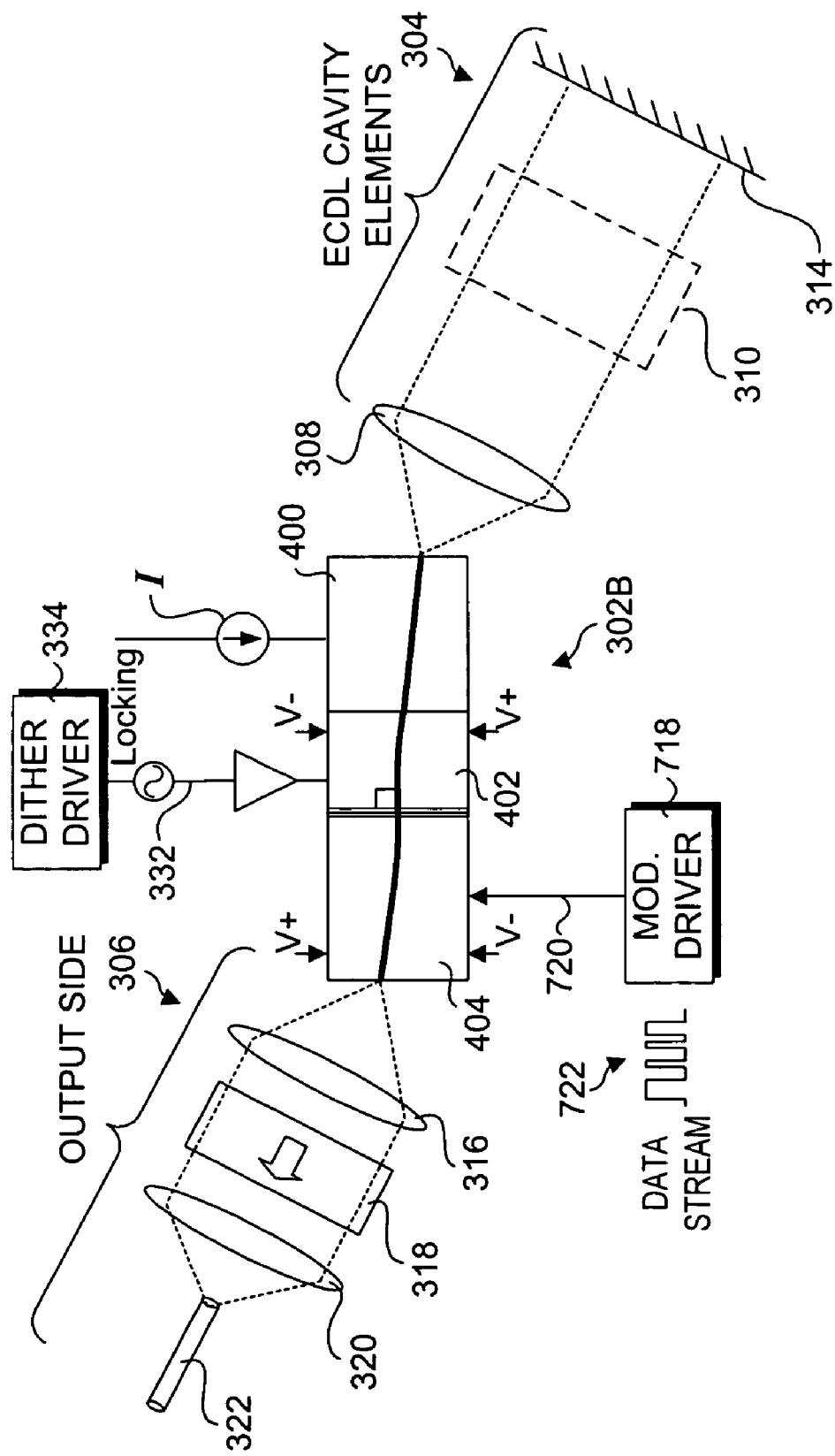
FIG. 3b is a schematic diagram illustrating a second exemplary semi-integrated ECDL configuration including an integrated structure having gain, phase control, and modulator sections that are optically-coupled via a bent waveguide, according to one embodiment of the invention.

FIGS. 3a and 3b respectively show semi-integrated ECDLs 300A and 300B corresponding to exemplary embodiments of the invention. ECDLs 300A includes an integrated structure 302A optically coupled between a set of ECDL cavity elements 304 and a set of output side elements 306. Similarly, ECDLs 300B includes an integrated structure 302B optically coupled between a set of ECDL cavity elements 304 and a set of output side elements 306.

In general, the set of ECDL cavity elements 304 will be substantially analogous to those discussed above with reference to FIG. 1a. For example, a typical set of ECDL cavity elements may include a collimating lens 308, a tuning filter element or elements 310, and a reflective element 314. Details of an exemplary tuning filter are discussed below. In general, reflective element 314 may comprise a mirror, grating, prism, or other reflector or retroreflector, which may also provide the tuning filter function in place of tuning filter element 310.

The outputs side elements 306 for each of semi-integrated ECDL lasers 302A and 302B are analogous to those described above with reference to FIG. 1a pertaining to the isolation function. These include a collimating lens 316, an optical isolator 318, a fiber focusing lens 320, and an output fiber 322.

Figure 4A:
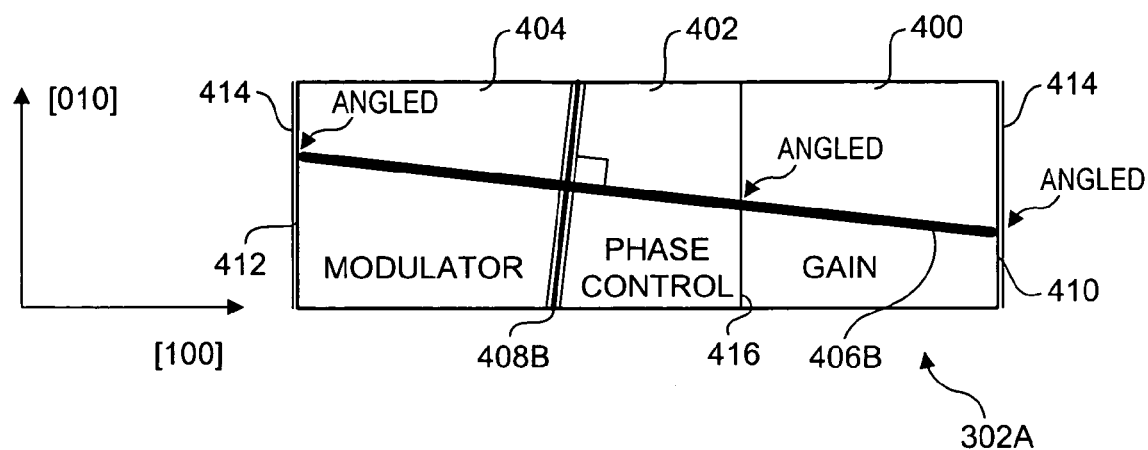
Figure 4B:
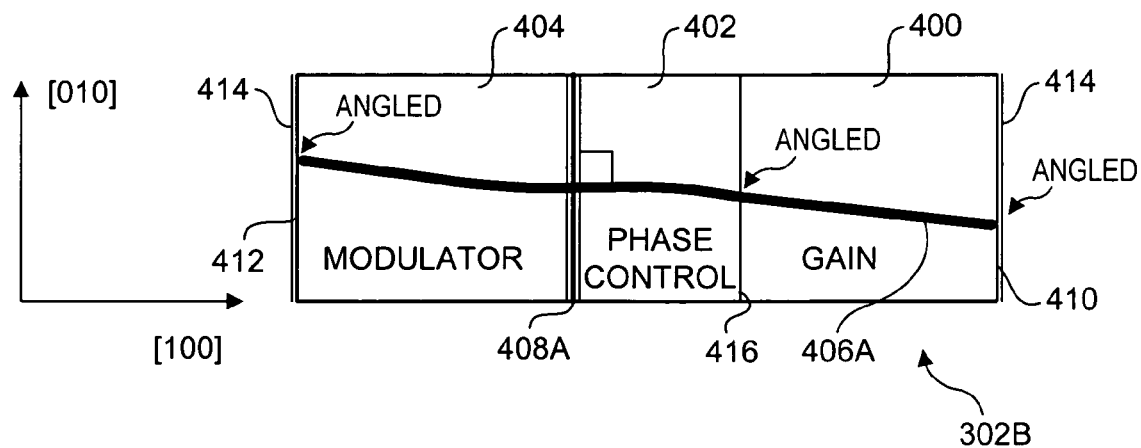
FIG. 4b is a schematic diagram illustrating further details of the integrated structure of FIG. 3b.

Further details of integrated structures 302A and 302B are shown in FIGS. 4a and 4b, respectively. Each of these integrated structures includes a gain section 400, a phase control section 402, and a modulator section 404. The gain, phase, and modulator sections for integrated structure 302A are optically coupled via a waveguide 406A, while these sections for integrated structure 302B are optically coupled via a waveguide 406B. In integrated structure 302A, a mirror 408A is formed between phase control section 402 and modulator section 404. Similarly, a mirror 408B is formed between phase control section 402 and modulator section 404 for integrated structure 302B.

Integrated structures 302A and 302B each include a non-reflective front facet 410 and a non-reflective rear facet 412. To make the facets non-reflective, an appropriate anti-reflective coating 414 is applied to each of non-reflective facets 410 and 412 in a manner similar to that discussed above for non-reflective facet 106.

Each of integrated structures 302A and 302B share similar qualities with respect to how waveguide 406 is configured at the junctions between the gain, phase, and modulator sections. In particular, the configuration of waveguide 406 is configured such that it is angled (i.e., non-perpendicular) relative to each of front and rear facets 410 and 412, and at the junction 416 between is gain section 400 and phase control section 402. Meanwhile, the configuration of waveguide 406A relative to mirror 408 is substantially perpendicular.

Integrated structure 302A employs a tilted waveguide geometry. That is, in this configuration the plane in which mirror 408A is formed is tilted at an angle relative to the crystalline plane structure of the substrate material from which integrated structure 302A is formed.

In contrast, laser source 302B uses a bent waveguide geometry to achieve the same ends. In this instance, the mirror plane is parallel to the crystalline plane of the substrate material, while the waveguide/junction interfaces are still angled. To obtain this configuration, portions of waveguide 406B are bent or radiused.

The angled and perpendicular waveguide/junction interfaces are configured as such to take advantage of well-known optical phenomena. More specifically, the optical phenomena concern the behavior of light as it passes between two materials having different indexes of refraction. Depending on the difference between the refractive indexes and angle of incidence, varying amounts of incident power will be reflected back. In the case of normal incidence, substantially all the reflected light is coupled into the waveguide while in the case of the angled incidence (optimum is about 6 deg) most of the reflected light leaves the waveguide (gets scattered) and therefore does not interact with the cavity light.

With the foregoing optical phenomena in mind, in one embodiment mirrors 408A and 408B are formed by removing or altering a planar portion of material between phase control and modulator sections 402 and 404 to form a gap between the two sections. This creates a difference between the index of refraction of phase control section 402 and the index of refraction of the gap material. This index of refraction difference along with the perpendicular configuration produces a partial reflection at the gap, resulting in a low reflectivity mirror (i.e., 2-10%). Thus, mirrors 408A and 408B define one of the reflectors for the effective laser cavity of ECDLs 300A and 300B, respectively, with the other end of the laser cavity defined by reflective element 314.

In one embodiment, mirror 408A or 408B may be formed by etching an air gap of controlled width. For example, such an air gap is disclosed by Y. Yuan, R. Jambunathan, J. Singh, "Finite-difference time-domain Analysis and experimental examination of the performance of a coupled-cavity MQW laser/active waveguide at 1.54 µm", *IEEE Journal of Quantum Electronics*, vol. 33, No. 3, pp. 408-415, 1997. If an anisotropic etching is used to form the mirror, the waveguide has to be bent so that it is parallel to a crystalline (i.e., etch) axis at the mirror location while it is angled near the faces.

In the meantime, it is not desired to have additional mirror elements in the laser cavity. Such elements may produce phase interferences, among other problems. Therefore, the angle of waveguides 406A and 406B are selected to be non-perpendicular at junction 416 and front and rear facets 410 and 412. In practice, a small portion of light is reflected at the interface plane between materials having dissimilar refractive indexes when the waveguide is tilted or bent. However, the angle tilt with respect to the facet planes provides mode mismatch for the reflected light, and thus doesn't create an interference with the lasing mode to which the laser is tuned.

As described below in further detail, various techniques may be applied to "tune" the laser to produce an optical output signal at a frequency corresponding to a desired communication channel. For example, this may be accomplished by adjusting one or more tuning elements, such as tuning filter elements 310, and producing a corresponding change in the cavity optical path length, thus changing the lasing mode frequency. The tuning filter elements attenuate the unwanted lasing modes such that the output beam comprises substantially coherent light having a narrow bandwidth.

Different techniques for monolithic integration of a phase control section and a modulator section with the gain chip have been developed. To minimize the absorption in the phase- and (unbiased) modulator sections the bandgap of these sections should be broadened by approximately 0.06-0.12 eV (blue shift of the absorption peak by 100-200 nm) compared to the gain section. This can be done by one of the following techniques. In each of the techniques, the integrated structure comprises a material suitable for forming applicable energy bandgaps. In one embodiment, the integrated structure is formed using an InGsAsP-based material.

A first technique uses an offset quantum-well (QW) structure (see, e.g., B. Mason, G. A. Fish, S. P. DenBaars, and L. A. Coldren, "Widely tunable sampled grating DBR laser with integrated electroabsorption modulator", *IEEE Photonics Technology Letters*, vol. 11, No. 6, pp. 638-640, 1999). In this structure, the multiquantum-well active layer is grown on top of a thick low bandgap (0.84-0.9 eV) quaternary waveguide. The two layers are separated by a thin (about 10 nm) stop etch layer to enable the QW's to be removed in the phase and modulator sections with selective etching. This low bandgap waveguide provides high index shift for the phase section of the laser at low current densities. The modulator section uses the same waveguide structure as the phase section with a reverse voltage applied to the electrodes.

A second technique, known as quantum well intermixing (QWI), relies on impurity or vacancy implantation into the QW region allowing its energy bandgap to be increased (see, e.g., S. Charbonneau, E. Kotels, P. Poole, J. He, G. Aers, J. Haysom, M. Buchanan, Y. Feng, A. Delage, F. Yang, M. Davies, R. Goldberg, P. Piva, and I. Mitchell, "Photonic integrated circuits fabricated using ion implantation", IEEE J. Selected Topics in Quantum Electronics, vol. 4, No. 4, pp. 772-793, 1998 and S. McDougall, O. Kowalski, C. Hamilton, F. Camacho, B. Qiu, M. Ke, R. De La Rue, A. Bryce, and J. Marsh, "Monolithic integration via a universal damage enhanced quantum-well intermixing technique", IEEE J. Selected Topics in Quantum Electronics, vol. 4, No. 4, pp. 636-646, 1998). Selective application of QWI to the phase control and modulator sections provides the required blue shift of the absorption peak of about 100-200 nm. This technique does not require re-growth and allows for better mode overlap with the quantum wells than the first technique.

A third technique employs asymmetric twin-waveguide technology (see, e.g., P. V. Studenkov, M. R. Gokhale, J. Wei, W. Lin, I. Glesk, P. R. Prucnal, and S. R. Forrest, "Monolithic integration of an all-optical Mach-Zehnder demultiplexer using an asymmetric twin-waveguide structure", IEEE Photonics Technology Letters, vol. 13, No. 6, pp. 600-603, 2001) where two optical functions of amplification and modulation (phase control) are integrated in separate, vertically coupled waveguides, each independently optimized for the best performance. In the modulator, the bulk waveguide material provides a wider spectral bandwidth than would be possible with a QW structure. Therefore, for widely tunable ECDL applications the first technique and the third technique with a bulk material in the modulator/ phase section waveguide should provide better results than QWI technique.

In another embodiment, mirror functionality is achieved by forming a thin Bragg grating with relatively flat reflectivity spectrum along a portion of the waveguide. This structure is similar to the Bragg grating structure used in edge-emitting DBR lasers, but has fewer reflective layers. A semi-integrated ECDL 300C illustrative of this type of configuration is shown in FIG. 3c. ECDL 300C includes an integrated structure 302C optically coupled between a set of ECDL cavity elements 304 and output side elements 306, which are substantially similar to the like-numbered elements discussed above with respect to FIGS. 3a and 3b.

Figure 4C:
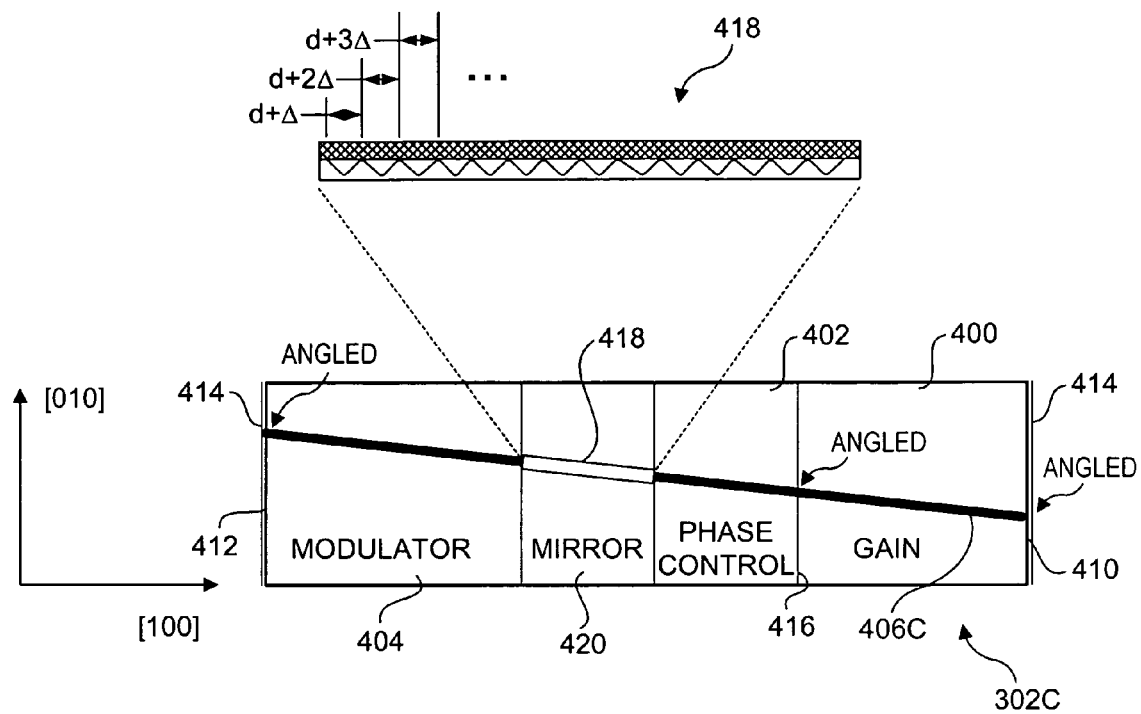
FIG. 4c is a schematic diagram illustrating further details of the integrated structure of FIG. 3c.

Rather than employing a partially-reflective air gap to act as a mirror element, integrated structure 302C employs a chirped Bragg grating 418, as shown in FIG. 4c. The chirped Bragg grating uses a grating structure similar to that employed for a DBR laser, except the grating is spaced unevenly (i.e., chirped) so as to produce multiple resonant modes. In one embodiment, chirped Bragg grating 418 is formed in a mirror section 420 that is disposed between a phase control section 402 and a modulator section 404. In general, the waveguide may have a tilted configuration (e.g., as depicted by a waveguide 406C in FIG. 4c), or may have a bent configuration (not shown) similar to shown in FIG. 4b. The spacing of the grating elements changes by about 3% from one side of grating to another in order to provide constant reflectivity across whole communication band (i.e., C- or L-band).

Figure 3D:
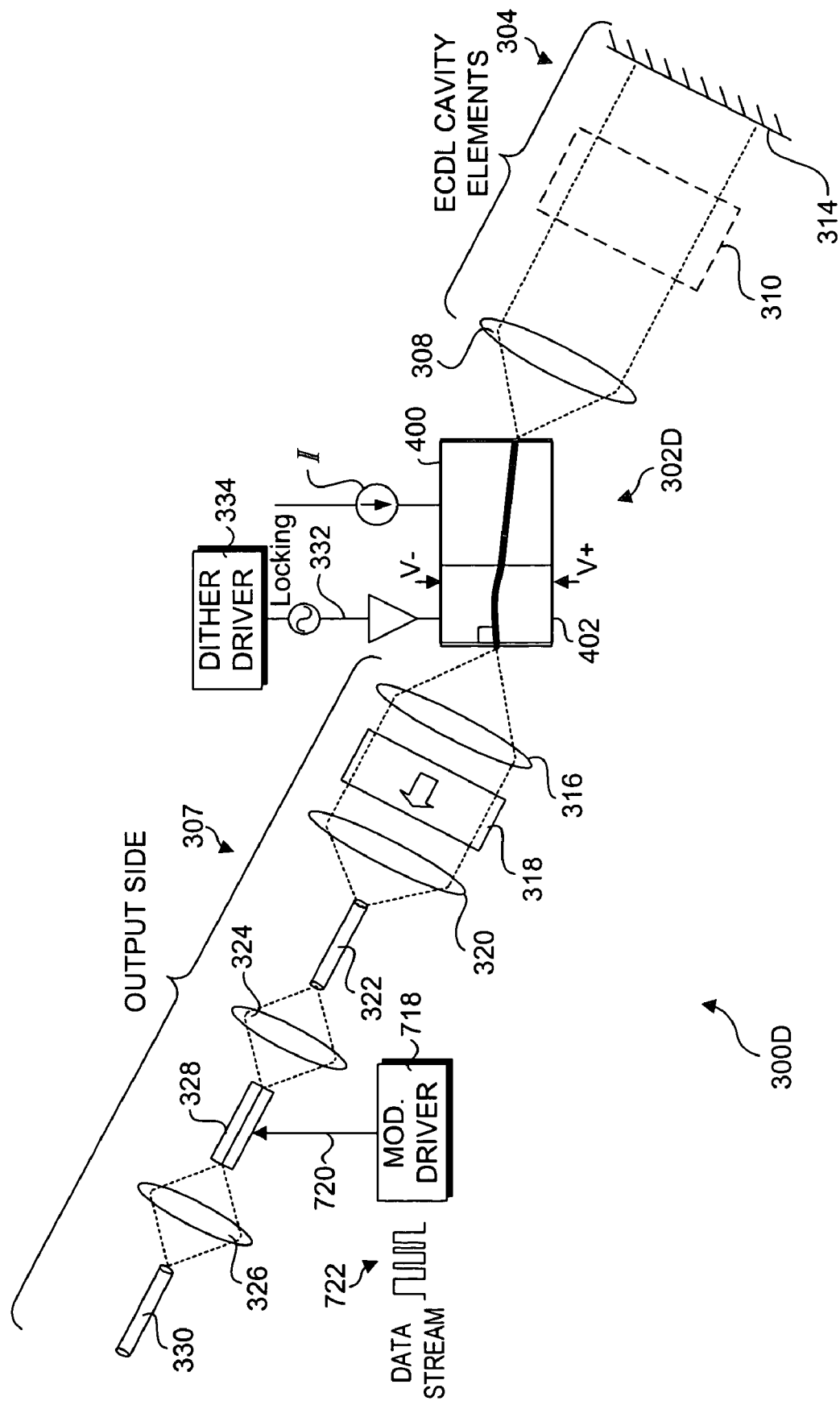
FIG. 3d is a schematic diagram illustrating a fourth exemplary semi-integrated ECDL configuration including an integrated structure having gain and phase control sections, and implementing a co-packaged modulator that is external to the integrated structure, according to one embodiment of the invention.
Figure 3E:
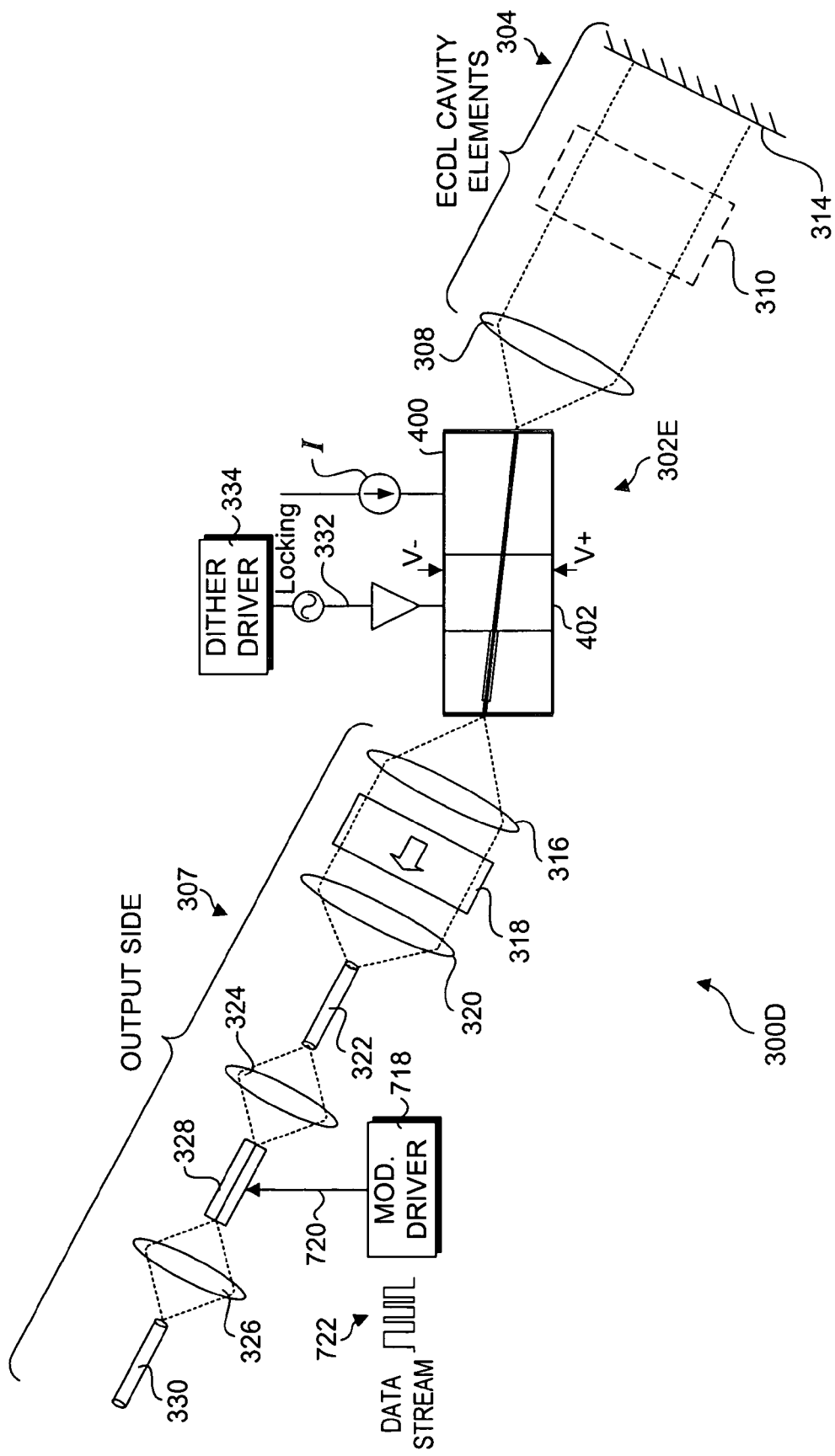
FIG. 3e is a schematic diagram illustrating a fifth exemplary semi-integrated ECDL configuration including an integrated structure having gain, phase control, and mirror sections, and implementing a co-packaged modulator that is external to the integrated structure, according to one embodiment of the invention.

In the embodiments of FIGS. 3d, 3e, 4d, and 4e, the modulator is a stand-alone chip co-packaged with the ECDL. This approach simplifies chip manufacturing but makes laser integration more labor-intensive. In further detail, the embodiments of each of FIGS. 3d and 3e include a set of output side elements 307 including an output collimating lens 316, an optical isolator 318, a fiber focusing lens 320, a fiber pigtail 322, a pair of coupling lenses 324 and 326, a modulator 328 and an output fiber segment 330. In the embodiment of FIG. 3d, an integrated structure 302D is optically coupled to and disposed between ECDL cavity elements 304 and output side elements 307. In the embodiment of FIG. 3e, an integrated structure 302E is optically coupled to and disposed between ECDL cavity elements 304 and output side elements 307.

Figure 4D:
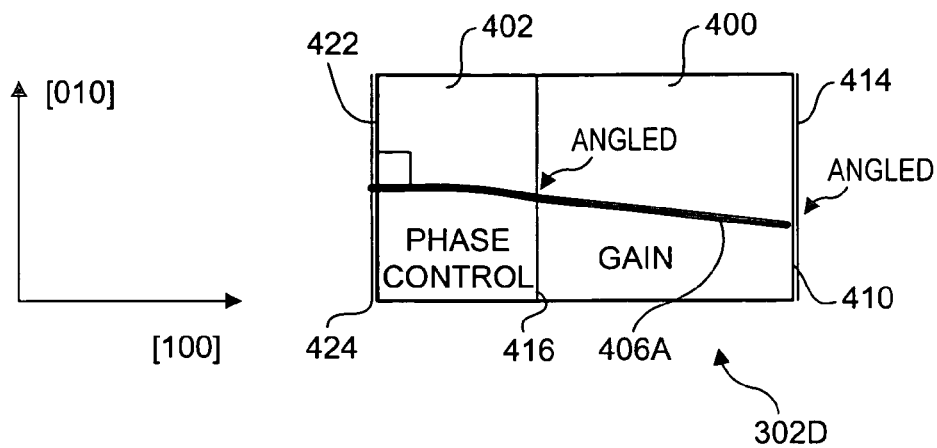
FIG. 4d is a schematic diagram illustrating further details of the integrated structure of FIG. 3d.

As shown in FIG. 4d, integrated structure 302D includes a gain section 400 formed adjacent to a phase control section 402, each of which is analogous to like-numbered elements discussed above. However, in this embodiment the front facet of the integrated structure is formed by a facet 422 defining a front facet of phase control section 402. In one embodiment, a partially reflective coating 424 may be added to facet 422 to enhance or suppress reflectivity. In another embodiment, proper cleaving of the facet is sufficient to effectuate the desired mirror functionality. Thus, in the embodiment of ECDL 300D in FIG. 3d, the laser cavity is defined by facet 422 and reflective element 314.

Figure 4E:
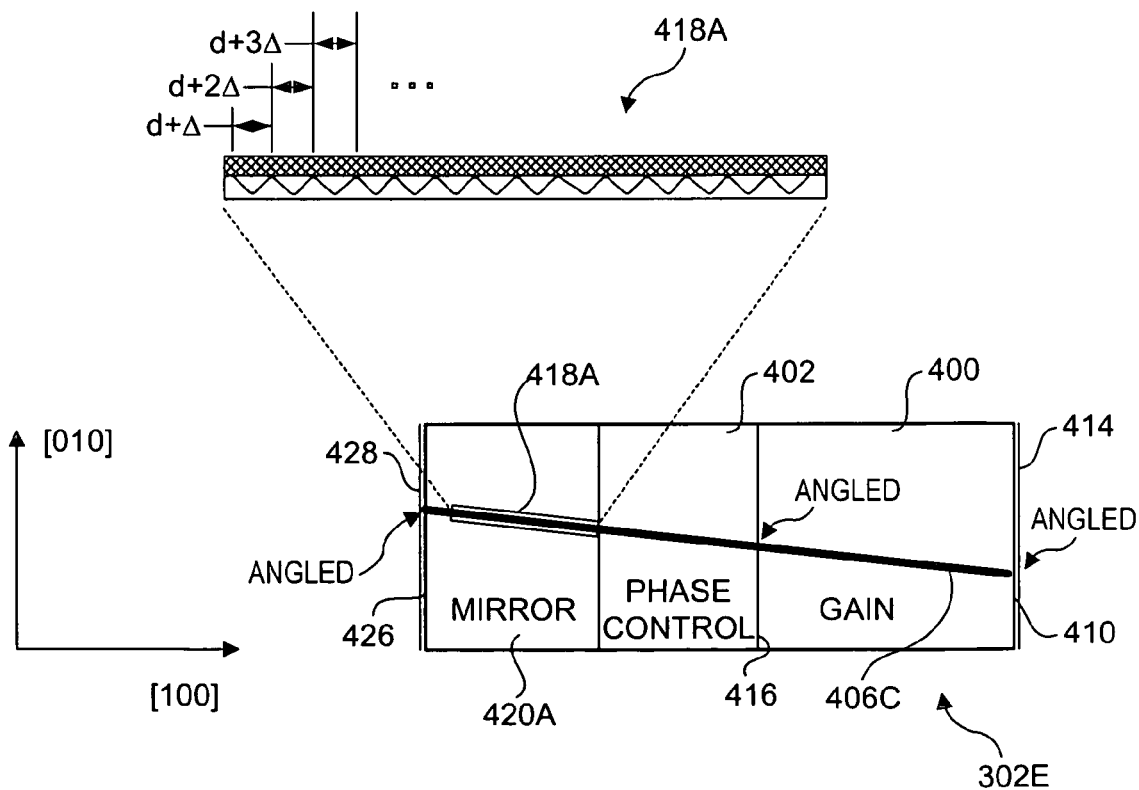
FIG. 4e is a schematic diagram illustrating further details of the integrated structure of FIG. 3e.

Details of an alternative mirror configuration employed by integrated structure 302E are shown in FIG. 4e. This embodiment adds a mirror section 420A that is roughly analogous to the mirror section 420 of integrated structure 302C. The mirror section includes a chirped Bragg grating 418A that is analogous to chirped Bragg grating 418 discussed above. The mirror section 420 also includes a facet 426 with an optional anti-reflective coating 428. Thus, facet 426 forms a front facet for integrated structure 302E, while the laser cavity for ECDL 300E (FIG. 3e) is defined by chirped Bragg grating 418A and reflective element 314.

In the embodiments of integrated structures 302D and 302E, the aforementioned QWI technique can be used for the gain/phase control integrated structure fabrication. The co-packaged modulator 328 can be of one of various types of components suitable for modulating an optical signal, including but not limited to an electroabsorption-, Mach-Zehnder-, or directional coupler-based modulator. Laser-to-modulator coupling can be achieved either directly by bringing two waveguides in close proximity to each other (about 1 micron—not shown) or by using coupling optics (such as shown in FIGS. 3d and 3e).

Ideally, it is desired to precisely control the frequency of the output beam over a frequency range corresponding to the various channel frequencies the ECDL is designed for. Under one embodiment, a frequency control scheme is implemented by minimizing cavity losses when tuned to a selected channel.

Returning to the illustrated example of FIG. 2, note the transmission peak 208 of the cavity mode nearest the selected channel is misaligned with the transmission peaks for the grid generator and channel selector. As a result, the intensity of the laser output is attenuated due to the misalignment, which is reflected in the form of cavity losses. Various mechanisms may be employed to shift the cavity mode transmission peaks such that they are aligned with the grid generator and channel selector transmission peaks, thus controlling the laser frequency so it corresponds to the selected channel. Generally, under such schemes the optical path length of the laser cavity is adjusted so that it equals a multiple half-wavelength (λ/2) of the transmission wavelength selected by the grid etalon and channel selector (i.e., the wavelength at which grid etalon and channel selector transmission peaks are aligned). In one embodiment known as "wavelength locking," an electronic servo loop is implemented that employs a modulated excitation signal that is used to modulate the overall cavity optical path length, thereby producing wavelength and intensity modulations in the laser output. A detection mechanism is employed to sense the intensity modulation (either via a measurement of the laser output intensity or sensing a junction voltage of the gain medium chip) and generate a corresponding feedback signal that is processed to produce a wavelength error signal. The wavelength error signal is then used to adjust the unmodulated (i.e., continuous or steady-state) overall cavity optical path length so as to align the transmission peak of the cavity mode with the transmission peaks of the grid generator and channel selector.

In accordance with another aspect of semi-integrated ECDLs 300A-E, wavelength locking is achieved via modulation of phase control section 402 (i.e., phase control modulation). Under this technique, a "dither" or modulation signal is supplied to cause a corresponding modulation in the optical path length of the portion of the waveguide passing through phase control section 402, and thus modulate the optical path length of the laser cavity. This produces a modulated phase-shift effect, resulting in a small frequency modulation (i.e., perturbation) of the lasing mode. The result of this frequency modulation produces a corresponding modulation of the intensity (power) of the output beam, also referred to as amplitude modulation. This amplitude modulation can be detected using various techniques. In one embodiment, the laser diode junction voltage (the voltage differential across gain section 400) is monitored while supplying a constant current to the gain section's laser diode, wherein a minimum measured diode junction voltage corresponds to a maximum output intensity. In another embodiment, a beam splitter is employed to split off a portion of the output beam such that the intensity of the split-off portion can be measured by a photo-electric device, such as a photodiode. The intensity measured by the photodiode is proportional to the intensity of the output beam. The measured amplitude modulation may then be used to generate an error signal that is fed back into a servo control loop to adjust the (substantially) continuous optical path length of the laser so as to produce maximal intensity.

Figure 5:
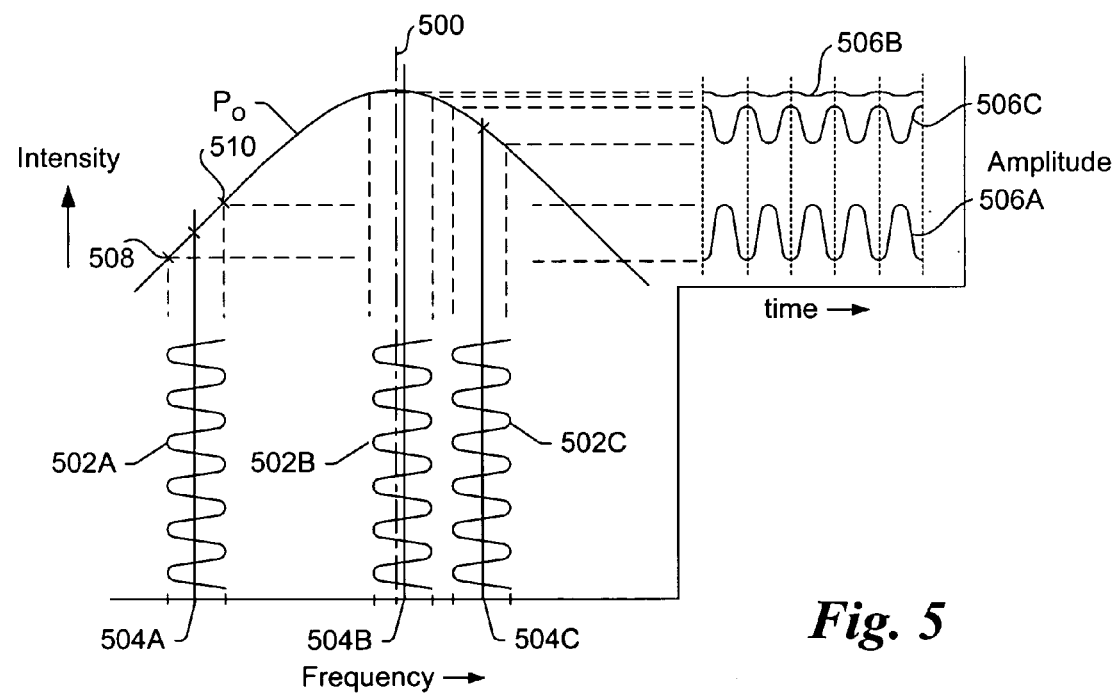
FIG. 5 is a diagram illustrating the effect modulating the optical path length of the laser cavity has on the frequency of the lasing mode and the modulation of the laser's output intensity.

One embodiment of the foregoing scheme is schematically illustrated in FIG. 5. The diagram shows a power output curve $P_O$ that is illustrative of a typical power output curve that results when the lasing mode is close to a desired channel, which is indicated by a channel frequency centerline 500. The objective of a servo loop that employs the phase-shift modulation scheme is to adjust one or more optical elements in the laser cavity such that lasing frequency is shifted toward the desired channel frequency. This is achieved through use of a demodulated error signal that results from frequency modulation of the lasing mode. Under the technique, a modulation (dither) signal is used to modulate the optical path length of the effective laser cavity by modulating the optical path length of phase control section 402. In the illustrated embodiment, a modulated signal comprising a wavelength locking excitation signal 332 is generated by a dither driver 334 and supplied to phase control section 402. This modulation causes a frequency excursion that is relatively small compared to the channel spacing for the laser. For example, in one embodiment the modulation may have an excursion of 4 MHz, while the channel spacing is 50 GHz.

Modulated signals 502A, 502B, and 502C respectively correspond to (average) laser frequencies 504A, 504B, and 504C. Laser frequency 504A is less than the desired channel frequency, laser frequency 504C is higher than the desired channel frequency, while 504B is near the desired channel frequency. Each modulated signal produces a respective modulation in the intensity of the output beam; these intensity modulations are respectively shown as modulated amplitude waveforms 506A, 506B, and 506C. Generally, the intensity modulations can be measured in the manners discussed above for determining the intensity of the output beam.

As depicted in FIG. 5, the peak-to-valley amplitude of waveforms 506A, 506B, and 506C is directly tied to the points in which the modulation limits for their corresponding frequency modulated signals 502A, 502B, and 502C intersect with power output curve $P_O$, such as depicted by intersection points 508 and 510 for modulated signal 502A. Thus, as the laser frequency gets closer to the desired channel frequency, the peak to valley amplitude of the measured intensity of the output beam decreases. At the point where the laser frequency and the channel frequency coincide, this value becomes minimized.

Figure 6:
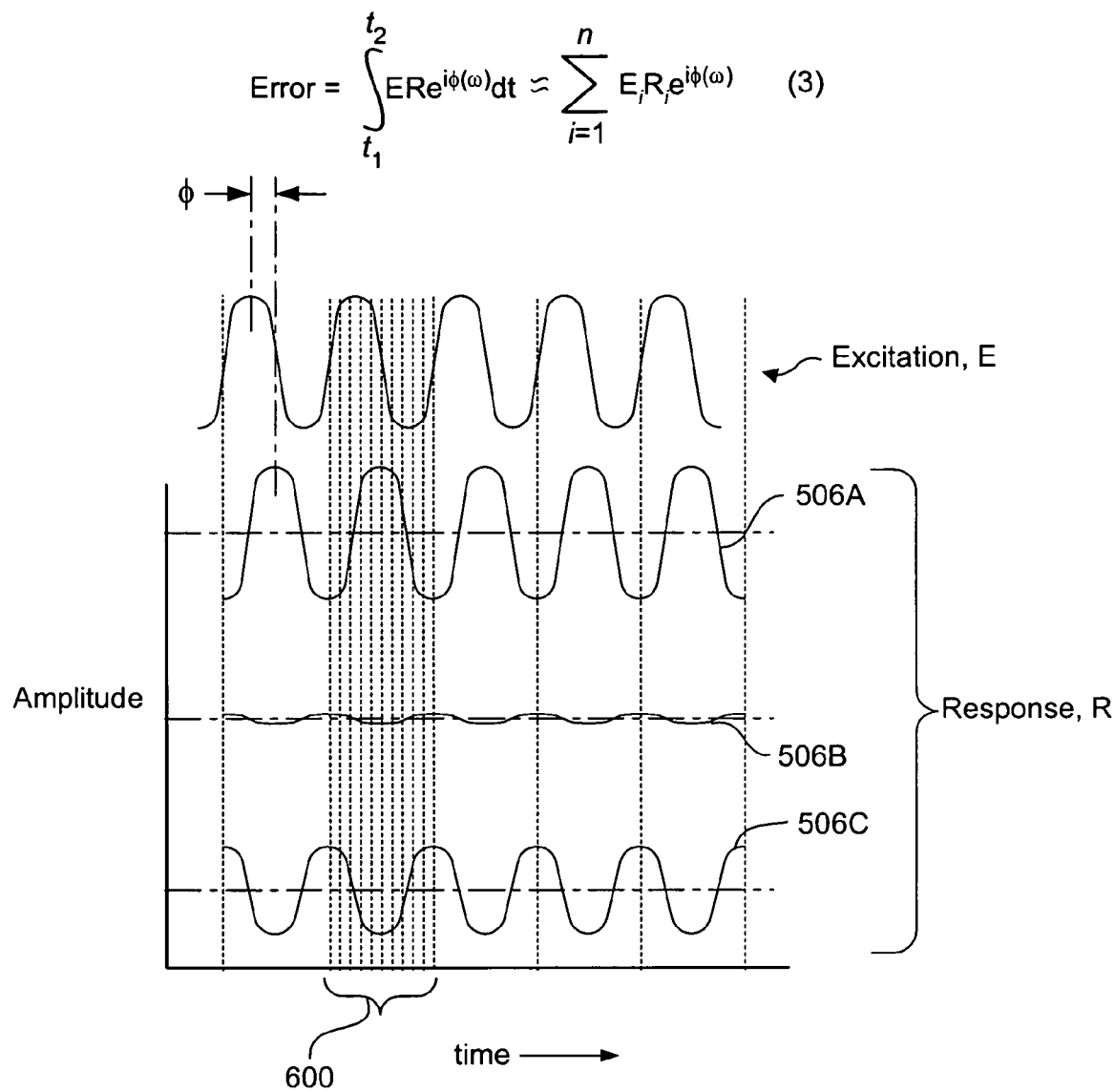
FIG. 6 is a diagram illustrating how a modulated excitation input signal and a resulting response output signal can be combined to calculate a demodulated error signal.

Furthermore, as shown in FIG. 6, the error may be derived from the equation:

$$\text{Error} = \int_{t_1}^{t_2} ERe^{i\phi(\omega)} dI \approx \sum_{i=1}^{n} E_i R_i e^{i\phi(\omega)} \tag{3}$$

wherein the non-italicized i is the imaginary number, Φ represents the phase difference between the excitation input (i.e., modulated signals 502A, 502B, and 502C) and the response output comprising the amplitude modulated output waveforms 506A, 506B, and 506C, and ω is the frequency of modulation. The integral solution can be accurately approximated by a discreet time sampling scheme typical of digital servo loops, as depicted by time sample marks 600.

In addition to providing an error amplitude, the foregoing scheme also provides an error direction. For example, when the laser frequency is in error on one side of the desired channel frequency (lower in the illustrated example), the excitation and response waveforms will be substantially in phase. This will produce a positive aggregated error value. In contrast, when the laser frequency is on the other side of the desired channel frequency (higher in the example), the excitation and response waveforms are substantially out of phase. As a result, the aggregated error value will be negative.

Generally, the wavelength locking frequency of modulation ω should be selected to be several orders of magnitude below the laser frequency. For example, modulation frequencies within the range of 500 Hz-100 kHz may be used in one embodiment with a laser frequency of 185-199 THz.

The teachings and principles of the embodiments disclosed herein may be implemented in semi-integrated ECDL lasers having a general configuration similar to those shown in each of FIGS. 3A-E. For example, with reference to FIG. 7, an ECDL 700 is shown including various elements common to ECDL 300A having like reference numbers, such as a integrated structure 302A, collimated lens 308, etc. The various optical components of the ECDL 700 are mounted or otherwise coupled to a base 702. For the purpose of illustration, the integrated structure 302A is not shown in its proper orientation in FIG. 7; in practice, the configuration would resemble that shown in FIG. 3a.

Semi-integrated ECDL 700 includes a controller 704 that is used to effect tuning in response to an input channel signal 708. In general, input to the phase control section 402 will be used for very fine tuning adjustments, while coarser tuning adjustments will be made by means of tuning filter element(s) 310. Generally, tuning filter elements may comprise one or more etalons, gratings, prisms or other element or elements that are capable of providing feedback to gain section 400 at a selected wavelength or sets of wavelengths. The tuning filter element(s) 310 are controlled by a wavelength selection control block 706, which in turn is coupled to or included as part of controller 704. In response to an input channel command 708, the controller and/or wavelength selection control block adjust the tuning filter element(s) and phase control section 402 so as to produce a lasing mode corresponding to the desired channel frequency.

In some embodiments, the semi-integrated ECDLs described herein may employ a wavelength-locking (also referred to as channel-locking) scheme so as to maintain the laser output at a selected channel frequency (and thus at a corresponding predetermined wavelength). Typically, this may be provided via the phase modulation scheme described above, wherein the optical path length of the laser cavity is modulated at a relatively low frequency (e.g., 500 Hz-20 KHz) at a small frequency excursion. In one embodiment, modulation section 402 is employed for this purpose. In response to a modulated wavelength locking excitation signal 332 generated by controller 704 and amplified by an amplifier 710, the optical path length of phase control section 402 (along waveguide 406A) is caused to modulate, thereby inducing a wavelength modulation in the laser's output. Generally, the optical path length modulator may comprise an element that changes its optical path length in response to an electrical input. In one embodiment, the modulation is caused by energizing the active region in waveguide 406A in the phase control section 402. As a result, by providing a modulated voltage signal across the quantum well, the optical path length of the laser cavity can be caused to modulate.

As is well-known, when the laser's output has a frequency that is centered on a channel frequency (in accordance with appropriately configured filter elements), the laser intensity is maximized relative to non-centered outputs. As a result, the wavelength modulation produces an intensity modulation having an amplitude indicative of how off-center the lasing mode is, as discussed above with reference to FIGS. 5 and 6. A corresponding feedback signal may then be generated that is received by controller 704 and processed to adjust the overall cavity length via phase control section 402.

Figure 7:
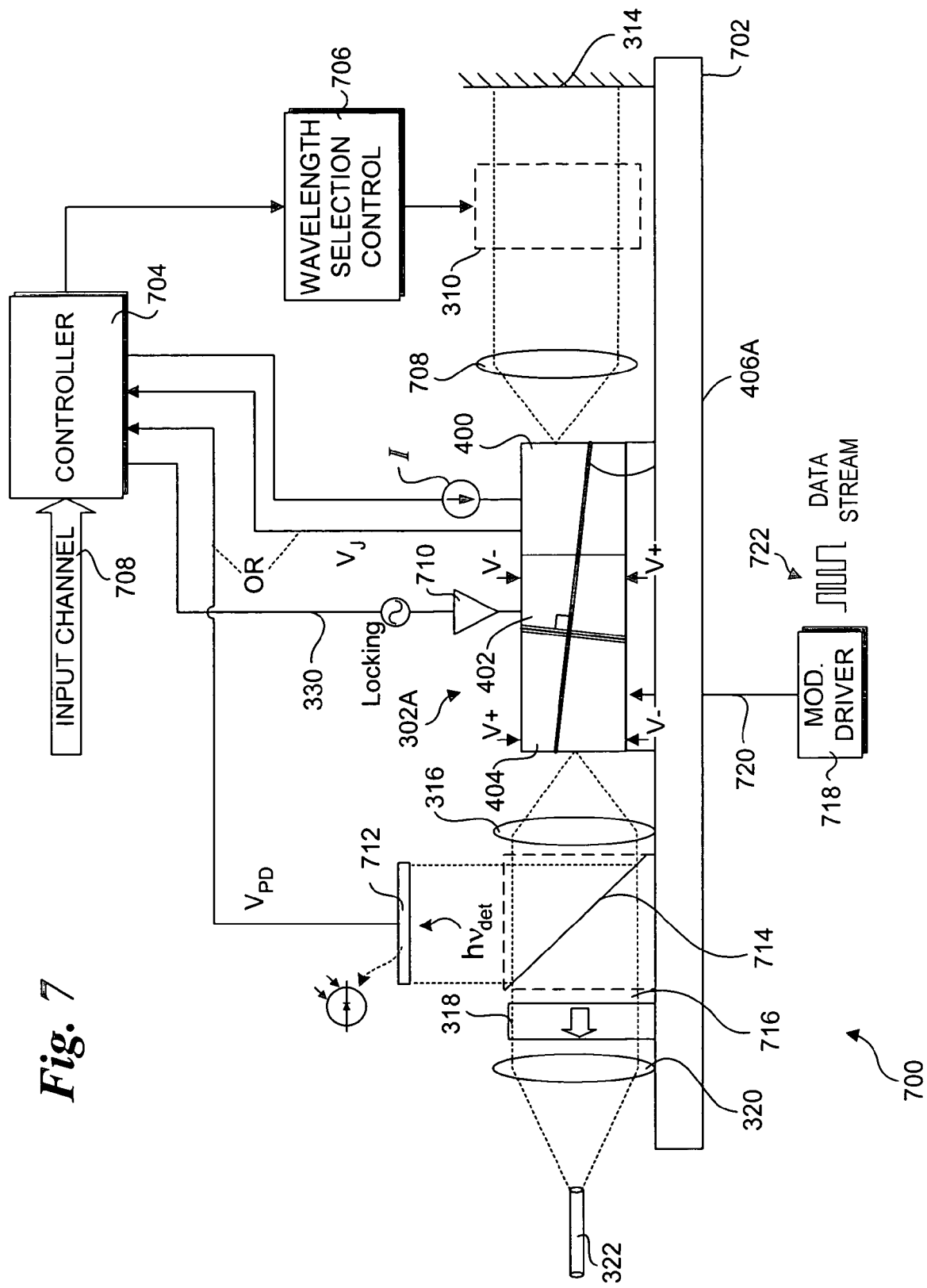
FIG. 7 is a schematic diagram illustrating the semi-integrated ECDL of FIG. 3 and further including control system elements (for the purpose of illustration, the integrated structure 302A is not shown in its proper orientation)

For example, in the illustrated embodiment of FIG. 7, a photodetector 712 is used to detect the intensity of the laser output. A beam splitter 714 is disposed in the optical path of output beam 716, causing a portion of the output beam light to be redirected toward photodetector 712. In one embodiment, photodetector 712 comprises a photo diode, which generates a voltage charge in response to the light intensity it receives ($hv_{det}$). A corresponding voltage $V_{PD}$ is then fed back to controller 704.

In one embodiment, controller 704 includes a digital servo loop (e.g., phase lock loop) that is configured to adjust phase control section 402 such that the amplitude modulation of the light intensity detected at photodectector 712 is minimized, in accordance with a typical intensity vs. frequency curve for a given channel and corresponding filter characteristics. In another embodiment, the junction voltage across gain diode chip ($V_J$) is employed as the intensity feedback signal, rather than $V_{PD}$. An error signal is then derived by based on the amplitude modulation and phase of $V_{PD}$ or $V_J$ in combination with wavelength locking excitation signal 332. In response to the error signal, an appropriate adjustment to wavelength locking excitation signal 332 is generated. Adjustment of phase section 402 causes a corresponding change in the overall (continuous) cavity length, and thus the lasing frequency. This in turn results in (ideally) a decrease in the difference between the lasing frequency and the desired channel frequency, thus completing the control loop.

Semi-integrated ECDL 700 also provides for data modulation via the integrated modulator section 404. For example, light in waveguide 406A passing out of the laser cavity through mirror 408A comprises a non-modulated output signal (initially). By applying a modulated voltage across the portion of waveguide 406A passing through modulator section 404, the output signal can be modulated with data. In one embodiment, a modulator driver 718 is used to generate a modulator drive signal 720 to form a modulated output signal in response to an input data stream 722. In general, modulator driver 718 may comprise a separate component, or may be integrated into and/or controlled by controller 704.

Figure 7A:
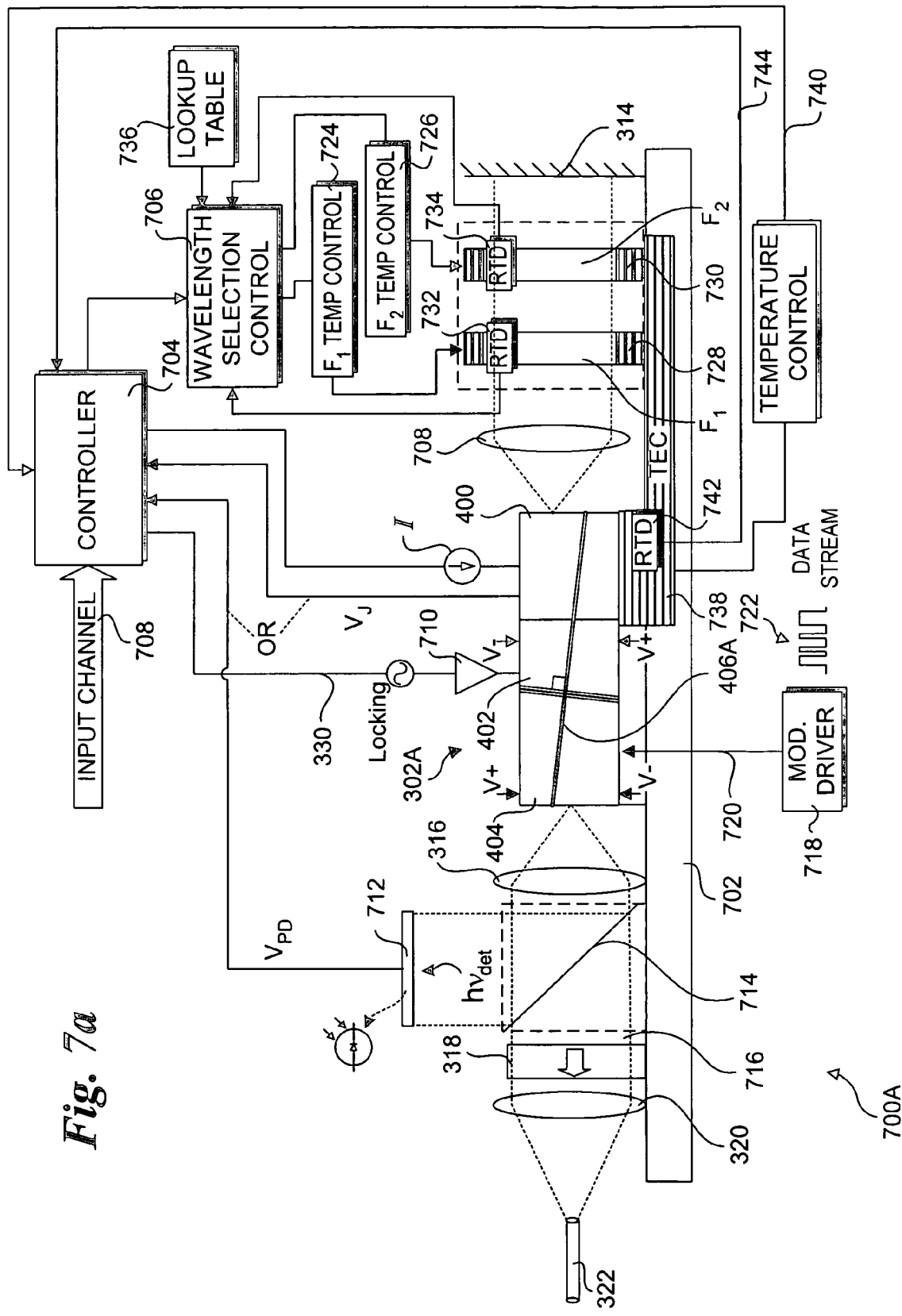
FIG. 7a is a schematic diagram illustrating further details of the semi-integrated ECDL of FIG. 7 (for the purpose of illustration, the integrated structure 302A is not shown in its proper orientation)

In general, various tuning filter elements and corresponding tuning adjustment techniques may be employed for channel selection purposes. For example, in a semi-integrated ECDL 700A shown in FIG. 7a, tuning filter elements 310 comprise first and second tunable filters $F_1$ and $F_2$. In one embodiment, filters $F_1$ and $F_2$ comprise respective etalons, either made of a solid material or being gas filled. In one embodiment, filter tuning is effectuated by changing the optical path length of each etalon. This in turn may be induced by changing the temperature of the etalons, according to one embodiment. Alterative, the etalons may be made of an electro-optic material that changes its index of refraction in response to an electric input (e.g., Lithium Niobate).

Semi-integrated ECDL 700A now also shows further details of an exemplary channel selection subsystem. It is noted that although the wavelength selection control block is shown external to controller 704, the control aspects of this block may be provided by the controller alone. Wavelength selection control block 706 provides electrical outputs 724 and 726 for controlling the temperatures of filters $F_1$ and $F_2$, respectively. In one embodiment, a temperature control element is disposed around the perimeter of a circular etalon, as depicted by heaters 728 and 730. Respective RTDs 732 and 734 are employed to provide a temperature feedback signal back to wavelength selection control block 706.

Generally, etalons are employed in laser cavities to provide filtering functions. As discussed above, they essentially function as Fabry-Perot resonators, and provide a filtering function defining a set of transmission peaks in the laser output. The FSR spacing of the transmission peaks is dependent on the distance between the two faces of the etalon. As the temperatures of the etalons change, the etalon material is caused to expand or contract, thus causing the distance between the faces to change. In addition, temperature change causes change of the refractive index of the etalons. This effectively changes the optical path length of the etalons, which may be employed to shift the transmission peaks.

The effect of the filters is cumulative. As a result, all lasing modes except for a selected channel lasing mode can be substantially attenuated by lining up a single transmission peak of each filter. In one embodiment, the configurations of the two etalons are selected such that the respective free spectral ranges of the etalons are slightly different. This enables transmission peaks to be aligned under a Vernier tuning technique similar to that employed by a Vernier scale. In one embodiment, one of the filters is employed as a grid generator, and is configured to have a free spectral range corresponding to a communications channel grid, such as the ITU wavelength grid. This wavelength grid remains substantially fixed by maintaining the temperature of the corresponding grid generator etalon at a predetermined temperature. At the same time, the temperature of the other etalon, known as the channel selector, is adjusted so as to shift its transmission peaks relative to those of the grid generator. By shifting the transmission peaks of the channel selector in this manner, transmission peaks corresponding to channel frequencies may be aligned, thereby producing a cavity lasing mode corresponding to the selected channel frequency. In another embodiment, the transmission peaks of both the filters are concurrently shifted to select a channel.

Generally, either of these schemes may be implemented by using a channel-etalon filter temperature lookup table in which etalon temperatures for corresponding channels are stored, as depicted by lookup table 736. Typically, the etalon temperature/channel values in the lookup table may be obtained through a calibration procedure, through statistical data, or calculated based on tuning functions fit to the tuning data. In response to input channel command 708, the corresponding etalon temperatures are retrieved from lookup table 736 and employed as target temperatures for the etalons using appropriate temperature control loops, which are well-known in the art.

Figure 8:
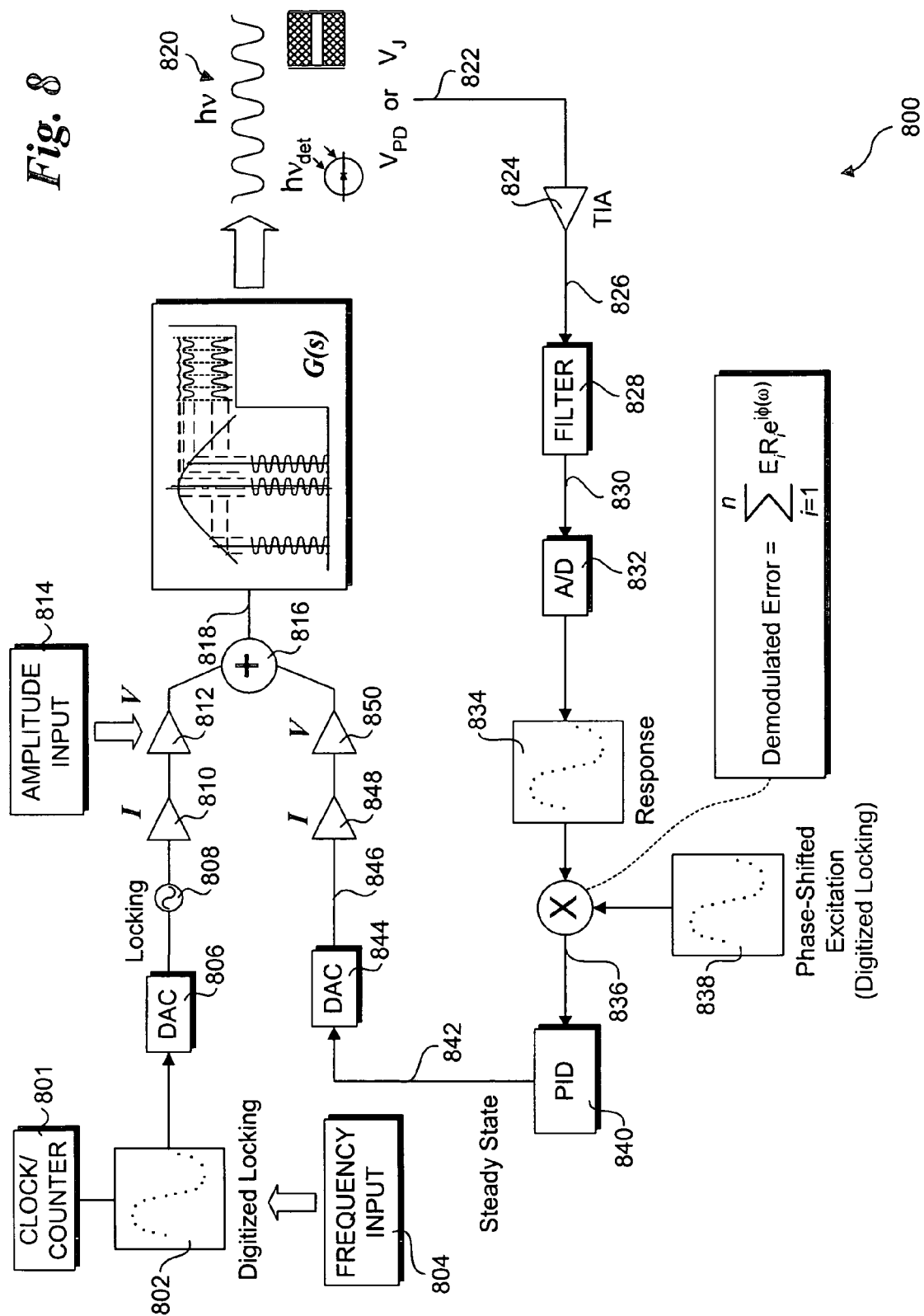
FIG. 8 is a schematic diagram of a digital servo control system for generating an excitation signal to drive a phase control section to produce a laser output including an intensity modulation that is detected and employed as a feedback signal for wavelength locking.

A servo control block diagram 800 corresponding to control operations performed by controller 704 and related components in accordance with one embodiment of the invention is shown in FIG. 8. The servo loop employs a digital sampling scheme common to many digital control systems. In one embodiment, the sampling frequency is 100 Hz. A signal indicating the start of each sampling period is provided by a clock/counter 801. During each sampling period, respective values from a digitized excitation signal waveform 802 retrieved. Generally, digitized excitation signal waveform 802 may be stored in a lookup table containing a drive signal value column and a cycle count column. Optionally, a current signal value may be generated in real-time based on an appropriate waveform function, such as $\sin(\theta)$, where $\theta$ is determined as a function of the clock count for the current cycle.

In one embodiment, the frequency of the excitation signal may be selected via a corresponding input control, such as depicted by a frequency input block 804. Generally, the frequency input may be provided by means of an analog or digital control (e.g., an analog or digital potentiometer), or by means of a computer-based input. For example, a software program running on a host computer may provide a user-interface to enable a user to select a frequency of the excitation signal. Corresponding information could then be communicated to controller 704. In one embodiment, respective lookup tables are provided for various frequencies or ranges of frequency. In the real-time sinusoid calculation, the update frequency or granularity of the calculation may be adjusted based on the selected frequency.

In one embodiment, appropriate waveform values are retrieved from a lookup table and provided as an input to a digital-to-analog converter (DAC) 806. When a digitized waveform is fed into a DAC at a fixed rate (i.e., sampling frequency), the DAC will output a smoothed analog waveform corresponding to the input digital waveform. This analog waveforms is depicted as modulation signal 808.

Next, the modulation signal is fed into an amplifier to amplify both the drive current and voltage amplitude of the signal, thereby producing an appropriate excitation signal that is used to drive the cavity optical path length modulator. This amplification is depicted by respective current and voltage amplifiers 810 and 812. In addition to frequency control, means may be provided for selecting and/or adjusting the line width of the laser output, which is dependent on the frequency excursion caused by the cavity optical path length modulation amplitude. In one embodiment, a control input similar to that described above for frequency input 804 is employed, as depicted by an amplitude input block 814.

The amplified modulation signal is next combined with a steady state tuning feedback signal at an adder block 816 to form a combined drive signal 818. As described below in further detail, the steady state tuning signal is used to provide a steady state voltage to the phase control section 402, while the amplified modulation signal comprises a voltage that is modulated on top of the steady state signal.

The combined drive signal is supplied to the phase control section 402 of an integrated structure to cause a modulation in the laser cavity optical path length (more specifically, the portion of the waveguide passing through the phase control section), resulting in a modulation in the wavelength and intensity of the output of the laser. This corresponds to a transfer function $G(s)$ of the laser, with the resulting wavelength and intensity modulations shown at 820.

In response to a detected intensity modulation in the laser output, a corresponding electrical feedback signal 822 is generated. As described above, this feedback signal may comprise a signal derived from direct measurement of the intensity modulation using a photo-electric sensor or the like (as depicted by $V_{PD}$), or may be obtained by measuring the laser diode junction voltage $V_J$, which is indicative of the intensity modulation. The electrical feedback signal is then amplified by a trans-impedance amplifier (TIA) 824, producing an amplified electrical feedback signal 826.

At this point, the amplified feedback signal may be passed through an optional filter 828. In one embodiment, filter 828 comprises a bandpass filter. In general, the band-pass filter should be configured to enable signal components having frequencies corresponding to the modulation frequency range to pass through, while substantially attenuating other signal components above or below these frequencies. In another embodiment, a low-pass filter is employed instead of a band-pass filter. In this instance, the cut-off frequency of the low-pass filter should be selected based on the maximum anticipated modulation frequency to be employed. In yet another embodiment, the band-pass or low-pass filter is tunable, enabling the filter characteristics to be tuned in accordance with the modulation frequency currently employed.

Thus, after passing through filter 828 (if employed), a filtered feedback signal 830 is produced. This feedback signal is then fed into an analog-to-digital (A/D) converter 832, which converts the signal into a digital pulse train, illustrated by a digitized response waveform 834. This waveform is illustrative of the modulation intensity produced in response to the excitation signal, as discussed above with reference to FIG. 6.

Next, a demodulated error signal 836 is produced. As discussed above, the demodulated error signal can be derived by the dot product of the response waveform times the excitation waveform in accordance with the summation formula of equation 3. This will generally be a function of the phase shift angle Φ between the excitation signal input and the resulting response signal output. It is advantageous to eliminate this phase shift angle, as it may lead to inconsistent error signals. In one embodiment, this is performed by digitally shifting the excitation by an amount substantially equal to the phase shift, as depicted by phase-shifted excitation signal 838. Generally, the amount of phase shift, which represents a time delay, can be numerically calculated or empirically derived (most common). In general, the primary components of the phase shift are due to time delays caused by the various amplifiers, filters, and optical elements employed to induce the intensity modulation and process the corresponding feedback signal.

The demodulated error signal is then provided as an input to a PID (proportional, integral and derivative) control block 840, which is well known in the control system art. The PID block outputs a digital steady state drive signal 842, which is converted into an analog signal 846 by DAC 844. This analog signal is then fed into an amplifier to amplify both the drive current and voltage amplitude of the signal, thereby producing an appropriate steady state drive signal that is used to provide the steady state drive voltage to the phase control section. This amplification is depicted by respective current and voltage amplifiers 848 and 850.

Figure 9:
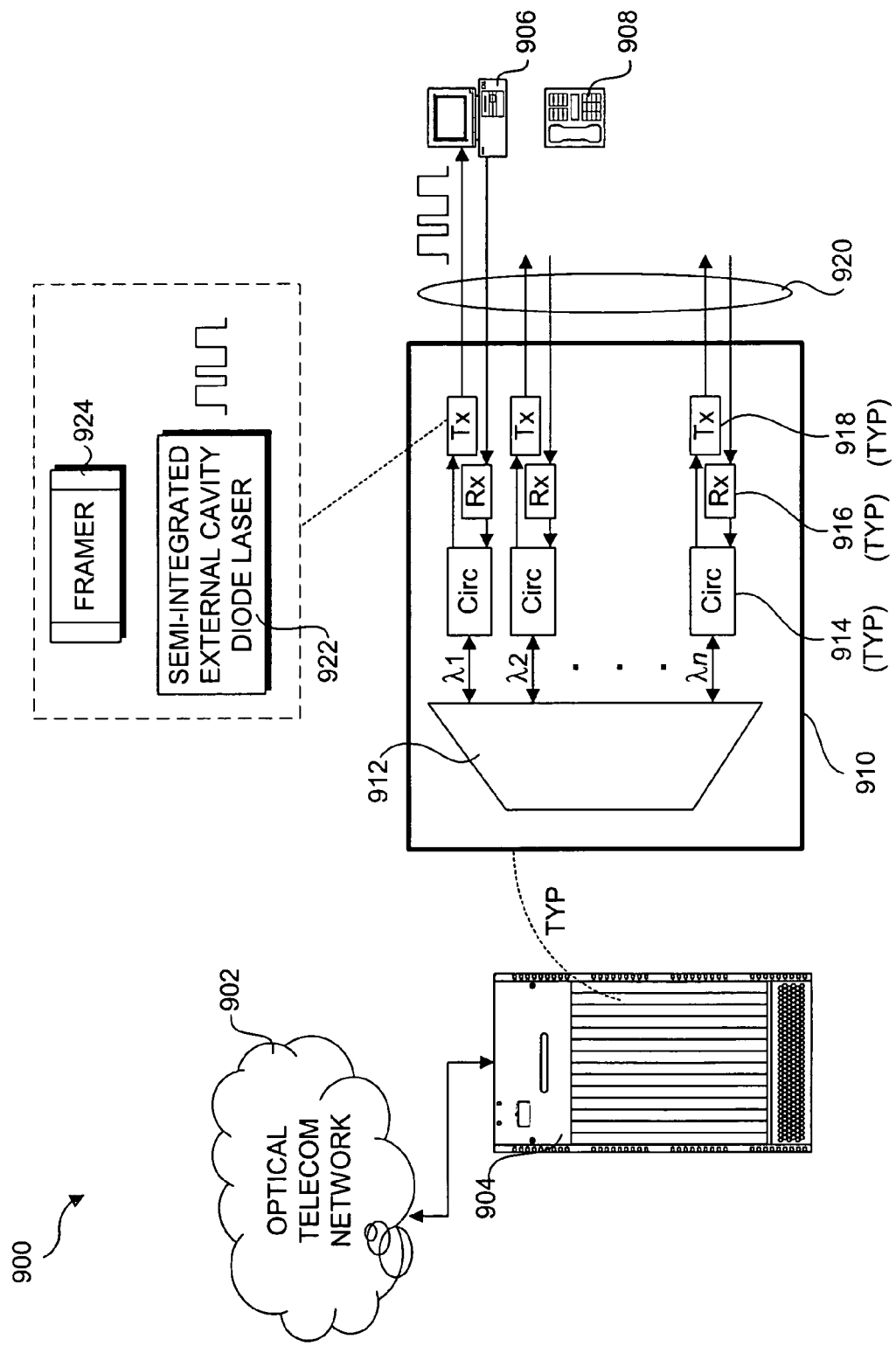
FIG. 9 is a schematic diagram of a communication network including a network switch in which tunable ECDLs in accordance with embodiments of the invention may be deployed.

FIG. 9 shows a communication system 900 in accordance with an embodiment of the invention in which an optical network is coupled to a plurality of data and voice subscribers lines by an optical mux/demux utilizing tunable semi-integrated ECDL's that may be tuned to the center frequency of any of the WDM channels on the optical network. The communication system includes an optical network 902, a network switch 904, a data terminal 906, and a voice terminal 908. The modulated data may be carried on a number of channels in multiple access protocols including but not limited to: wavelength division multiplexing (WDM), dense wavelength division multiplexing (DWDM), frequency division multiple access (FDMA), etc. Currently, this expansion of bandwidth is primarily being accomplished by WDM, in which separate subscriber/data session may be handled concurrently on a single optical fiber by means of modulation of each of those subscriber datastreams on different portions of the light spectrum. The precise center frequencies of each channel are specified by standard setting organizations such as the International Telecommunications Union (ITU). The center frequencies are set forth as part of a wavelength grid that defines the center frequencies and spacing between channels. Typically, the channel frequencies are evenly spaced so that the separation between any two channels is an integer multiple of a selected fundamental spacing.

Network switch 904 provides network-switching operations, as is well-known in the art. This is facilitated by optical transceivers that are mounted on fiber line cards 910. Each fiber line card includes a multi-state multiplexer/demultiplexer (mux/demux) 912, a circulator bank including circulators 914, a receiver bank including receivers 916, and a transmitter bank including transmitters 918. The mux/demux is a passive optical device that divides wavelengths (or channels) from a multi-channel optical signal, or combines various wavelengths (or channels) on respective optical paths into one multi-channel optical signal depending on the propagation direction of the light.

In the receive mode, after de-multiplexing, each individual channel is passed via a corresponding circulator 914 within the circulator bank to a corresponding receiver 916 in the receiver bank. Each receiver 916 includes a narrow bandpass photodetector, framer, and decoders (not shown). Switches (not shown) couple the receiver over a corresponding one of subscriber lines 920 to a data or voice terminal 906 or 908, respectively.

In the transmit mode, each line card transmitter bank includes a bank of lasers 922, including n (e.g., 128) semi-integrated ECDLs radiating light at one of the selected center frequencies of each channel of the telecommunications wavelength grid. The wavelength range of current ITU-defined grids is split between three bands: S-band (1492-1529 nm), C-band (1530-1570 nm), and L-band (1570-1612 nm). Each subscriber datastream is optically modulated onto the output beam of a corresponding ECL having a construction and operation in accordance with the embodiments of the invention discussed above. A framer 924 permits framing, pointer generation and scrambling for transmission of data from the bank of semi-integrated ECDLs and associated drivers. The modulated information from each of the lasers is passed via a corresponding circulator into mux/demux 912, which couples the output to a single optical fiber for transmission. The operation of the fiber line card in the embodiment shown is duplex, meaning that bi-directional communications are possible.

Each of the embodiments described herein provide advantages over the conventional ECDL configurations, as well as DFB and DBR laser configurations. For example, conventional ECDL's may employ mechanical or thermal cavity length modulators, which have a substantially slower response time (1-1000 millisections) than equivalent cavity length modulation provided by an integrated phase control section (~1 nanosecond). Thus, replacing the conventional modulator function with an integrated phase control section makes channel locking much faster and more robust. While similar robustness may be achieved with external stand-alone electro-optic modulators (e.g, Lithium Niobate Mach-Zehnder modulators), these types of modulators are expensive and take up too much space.

As discussed above, the semi-integrated ECDL designs have the manufacturing benefit of integrated structures, while still providing a decoupled tuning mechanisms. This leads to enhanced performance over tunable DFB and DBR lasers.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
    an integrated structure having front and rear facets optically connected via a waveguide passing therethrough, the integrated structure further including;
        a gain section to emit a plurality of photons in response to a first input, having a facet defining the rear facet of the integrated structure;
        a phase control section disposed adjacent to the gain section, to modulate an optical path length of a portion of the waveguide passing through the phase control section in response to a second electrical input;
        a modulator section disposed adjacent to the phase control section, to modulate an optical output passing through a portion of the waveguide passing through the modulator section in response to a third electrical input, and having a facet defining the front facet of the integrated structure; and
        a partially-reflective mirror disposed between the phase control section and the modulator section, the partially-reflective mirror having a reflectivity of approximately 2-10 percent.

2. The apparatus of claim 1, wherein the waveguide is tilted relative to the front and rear facets of the integrated structure.

3. The apparatus of claim 1, wherein the partially-reflective mirror is oriented substantially perpendicular to a local portion of the waveguide proximate to the mirror.

4. The apparatus of claim 1, wherein the partially-reflective mirror is effectuated by an air gap defined between the phase control section and the modulator section.

5. The apparatus of claim 4, wherein the air gap is etched along a plane that is parallel to a crystalline plane structure of the integrated structure and wherein the waveguide is bent such that it is substantially perpendicular proximate to the air gap and angled relative to the front and rear facets of the integrated structure.

6. The apparatus of claim 4, wherein the air gap is etched along a plane that is angled relative to a crystalline plane structure of the integrated structure.

7. The apparatus of claim 4, wherein the partially-reflective mirror comprises a chirped Bragg grating formed along a portion of the wave guide between the gain section and the modulator section.

8. The apparatus of claim 1, wherein bandgaps of portions of the waveguide passing through the phase control and modulator sections are broadened approximately 0.06-0.12 eV (electron-volts) relative to a bandgap of the portion of the waveguide passing through the gain section.

9. The apparatus of claim 1, wherein portions of the waveguide passing through the phase control and modulator sections comprise an offset quantum-well structure or a Quantum-well intermixed structure.

10. The apparatus of claim 1, wherein a portion of the waveguide is configured as asymmetric twin waveguides, wherein the optical functions of amplification and phase control are integrated in separate, vertically coupled waveguides.

11. The apparatus of claim 1, wherein the integrated structure is formed from an InGaAsP (Indium-Gallium-Arsenic-Phosphorus)-based semiconductor material.

12. A tunable laser, comprising:
    a base;
    an integrated structure operatively coupled to the base, having a front facet and a substantially non-reflective rear facet optically coupled via a waveguide passing therethrough, the integrated structure further including;
        a gain section to emit a plurality of photons in response to a first electrical input, having a facet defining the rear facet of the integrated structure;
        a phase control section disposed adjacent to the gain section, to modulate an optical path length of a portion of the waveguide passing through the control section in response to a second electrical input; the phase control section having;
        a partially-reflective mirror optically coupled to the portion of the waveguide passing through the phase control section, the partially-reflective mirror having a reflectivity of approximately 2-10 percent;
        a modulator section disposed adjacent to the phase control section, to modulate an optical output passing through a portion of the waveguide passing through the modulator section in response to a third electrical input, and having a facet defining the front facet of the integrated structure;
    a reflective element operatively coupled to the base and disposed opposite the substantially non-reflective rear facet to form an external cavity; and
    a tunable filter including at least one optical element operatively coupled to the base and disposed in the external cavity.

13. The tunable laser of claim 12, wherein the portion of the waveguide passing through the phase control section comprises an offset quantum-well structure or a quantum-well intermixed structure.

14. The tunable laser of claim 12, further comprising:
    a second modulator optically coupled to the waveguide at the front facet of the integrated structure, wherein the second modulator comprises one of an electroabsorption-, Mach-Zehnder-, or directional coupler-based modulator; and
    coupling optics disposed between the second modulator and the front facet of the integrated structure and configured to optically couple the second modulator to the waveguide.

15. The apparatus of claim 1, wherein the partially-reflective mirror is effectuated by a gap formed between the phase control section and the modulator section.

16. The tunable laser of claim 12, wherein the tunable filter comprises first and second tunable filters.

17. The apparatus of claim 1, wherein the tunable filter comprises a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of first optical filter to align a single transmission peak of each of the first and second sets of transmission peaks.

18. A telecommunication switch comprising;
a plurality of fiber line cards, each including,
- a multi-stage multiplexer/demultiplexer;
- a circulator bank, comprising a plurality of circulators operatively coupled to the multi-stage multiplexer/demultiplexer;
- a receiver bank, comprising a plurality of receivers operatively coupled to respective circulators; and a transmitter bank, comprising a plurality of transmitters operatively coupled to respective circulators, each transmitter comprising at tunable external cavity diode laser (ECDL), including;
- a base;
- an integrated structure operatively coupled to the base, having a front facet and a substantially non-reflective rear facet optically coupled via a waveguide passing therethrough, the integrated structure further including:
  - a gain section to emit a plurality of photons in response to a first electrical input, having a facet defining the rear facet of the integrated structure;
  - a phase control section disposed adjacent to the gain section, to modulate an optical path length of a portion of the waveguide passing through the control section in response to a second electrical input;
  - a modulator section disposed adjacent to the phase control section, to modulate an optical output passing through a portion of the waveguide passing through the modulator section in response to a third electrical input, having a facet defining the front facet of the integrated structure; and
  - a partially-reflective mirror disposed between the phase control section and the modulator section, the partially-reflective mirror having a reflectivity of approximately 2-10 percent;
- a reflective element, operatively coupled to the base and disposed opposite the substantially non-reflective rear facet to form an external cavity; and
- a tunable filter including at least one optical element operatively coupled to the base and disposed in the external cavity.

19. The telecommunications switch of claim 18, wherein at least one ECDL employs a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of first optical filter to align a single transmission peak of each of the first and second sets of transmission peaks.

20. The telecommunications switch of claim 19, wherein the first and second optical filters comprise respective thermally-tunable etalons.

* * * * *